(12) United States Patent
Sato et al.

(10) Patent No.: US 6,475,864 B1
(45) Date of Patent: Nov. 5, 2002

(54) METHOD OF MANUFACTURING A SUPER-JUNCTION SEMICONDUCTOR DEVICE WITH AN CONDUCTIVITY TYPE LAYER

(75) Inventors: Takahiro Sato; Katsunori Ueno; Tatsuhiko Fujihira, all of Nagano; Kenji Kunihara, Kanagawa; Yasuhiko Onishi; Susumu Iwamoto, both of Nagano, all of (JP)

(73) Assignee: Fuji Electric Co., Ltd. (JP)

( * ) Notice: Subject to any disclaimer, the term of this patent is extended or adjusted under 35 U.S.C. 154(b) by 70 days.

(21) Appl. No.: 09/694,098

(22) Filed: Oct. 23, 2000

(30) Foreign Application Priority Data

Oct. 21, 1999 (JP) ............................................. 11-300134
Jun. 21, 2000 (JP) ....................................... 2000-185655

(51) Int. Cl.[7] ............................................ H01L 21/336
(52) U.S. Cl. ...................................... 438/268; 438/286
(58) Field of Search ................................ 438/286, 268, 438/514

(56) References Cited

U.S. PATENT DOCUMENTS

| | | | |
|---|---|---|---|
| 4,754,310 A | 6/1988 | Coe | 357/13 |
| 5,216,275 A | 6/1993 | Chen | 257/493 |
| 5,438,215 A | 8/1995 | Tihanyi | 257/401 |
| 6,081,009 A | * 6/2000 | Neilson | 257/341 |

* cited by examiner

*Primary Examiner*—Richard Elms
*Assistant Examiner*—Beth E. Owens
(74) *Attorney, Agent, or Firm*—Rossi & Associates

(57) ABSTRACT

A method of manufacturing reduces costs and provides an excellent mass-productivity, super-junction semiconductor device, which facilitates reducing times of heat treatment of the alternating conductivity type layer subjects, and preventing the characteristics of the alternating conductivity type layer from being impaired. A surface MOSFET structure, including p-type base regions, p[+]-type contact region in p-type base region, an n[+]-type source region in p-type base region, a gate electrode layer and a source electrode, is formed in the surface portion of an n-type semiconductor substrate through the usual double difflusion MOSFET manufacturing process. An oxide film is deposited by the CVD method on the back surface of the semiconductor substrate, a resist mask for defining p-type partition regions is formed on the oxide film, the oxide film is removed by ion etching, and trenches are dug. The p-type epitaxial layers are buried in the trenches by selective epitaxial growth, and the remaining oxide film is removed. The portions of n-type semiconductor substrate not etched off remain as n-type drift regions, resulting in an alternating conductivity type layer formed of n-type drift regions and p-type partition regions. A drain electrode is deposited on the back surface of alternating conductivity type layer.

21 Claims, 25 Drawing Sheets

METHOD OF MANUFACTURING A SUPER-JUNCTION SEMICONDUCTOR DEVICE WITH AN CONDUCTIVITY TYPE LAYER

FIELD OF THE INVENTION

The present invention relates to a vertical semiconductor structure, applicable to semiconductor devices such as MOSFETs (insulated gate field effect transistors), IGBTs (insulated gate bipolar transistors), bipolar transistors and diodes, that facilitates realizing a high breakdown voltage and a high current capacity. The present invention relates also to a semiconductor device including such a vertical semiconductor structure and the method of manufacturing such a semiconductor device.

BACKGROUND ART

The semiconductor devices may be roughly classified into a lateral semiconductor device that arranges its electrodes on a major surface and a vertical semiconductor device that distributes its electrodes on both major surfaces facing opposite to each other. When the vertical semiconductor device is ON, a drift current flows in the thickness direction of the semiconductor chip (vertical direction). When the vertical semiconductor device is OFF, the depletion layers caused by applying a reverse bias voltage expand also in the vertical direction. FIG. 51 is a cross sectional view of a conventional planar-type n-channel MOSFET.

Referring now to FIG. 51, the vertical MOSFET includes an $n^+$-type drain layer 51 with low electrical resistance, a drain electrode 58 in electrical contact with $n^+$-type drain layer 51, a highly resistive n-type drift layer 52 on $n^+$-type drain layer 51, p-type base regions 53 formed selectively in the surface portion of n-type drift layer 52, a heavily doped $n^+$-type source regions 54 formed selectively in p-type base regions 53, a gate insulation film 55 on the extended portion of p-type base regions 53 extended between $n^+$-type source region 54 and n-type drift layer 52, a gate electrode layer 56 on gate insulation film 55, and a source electrode 57 in contact commonly with $n^+$-type source regions 54 and p-type base regions 53.

In the vertical semiconductor device shown in FIG. 51, highly resistive n-type drift layer 52 works as a region for making a drift current flow vertically when the MOSFET is in the ON-state. In the OFF-state of the MOSFET, n-type drift layer 52 is depleted to obtain a high breakdown voltage. Shortening the current path in highly resistive n-type drift layer 52 is effective for substantially reducing the on-resistance (resistance between the drain and the source) of the MOSFET, since the drift resistance is lowered in the ON-state of the device. However, the short current path in n-type drift layer 52 lowers the breakdown voltage (the voltage between the drain D and the source S), since the width between the drain D and the source S, for that the depletion layers expand from the pn-junctions between p-type base regions 53 and n-type drift layer 52, is narrowed and the electric field strength in the depletion layers soon reaches the maximum (critical) value for silicon.

However, in the semiconductor device with a high breakdown voltage, a thick n-type drift layer 2 inevitably causes high on-resistance and loss increase. Thus, the breakdown voltage or the on-resistance is improved at the sacrifice of the on-resistance or the breakdown voltage. In short, there exists a tradeoff relation between the on-resistance (current capacity) and the breakdown voltage of the MOSFET. The tradeoff relation exists in the other semiconductor devices such as IGBTs, bipolar transistors and diodes. The tradeoff relation exists also in lateral semiconductor devices, in that the flow direction of the drift current in the ON-state of the devices is different from the expansion direction of the depletion layers expanded by a reverse bias voltage applied in the OFF-state of the devices.

European Patent 0 053 854, U.S. Pat. No. 5,216,275, U.S. Pat. No. 5,438,215, and Japanese Unexamined Laid Open Patent Application H09(1997)-266311 disclose semiconductor devices include an alternating conductivity type drift layer formed of heavily doped n-type regions and p-type regions alternately laminated with each other. The alternating conductivity type drift layer is depleted to bear the breakdown voltage in the OFF-state of the device.

FIG. 52 is a cross sectional view of the vertical MOSFET disclosed in U.S. Pat. No. 5,216,275. Referring now to FIG. 52, the vertical MOSFET of FIG. 52 is different from the vertical MOSFET of FIG. 51 in that the vertical MOSFET of FIG. 52 includes a drift layer 62, that is not a single-layered one but formed of n-type first semiconductor regions 62a and p-type second semiconductor regions 62b alternately laminated with each other. In the figure, p-type well regions 63, $n^+$-type source regions 64, gate insulation films 65, gate electrode layers 66, a source electrode 67, and a drain electrode 68 are shown.

The drift layer 62 is formed in the following way. A highly resistive n-type layer is epitaxially grown on an $n^+$-type drain layer 61 used as a substrate. Trenches are dug through the n-type layer down to $n^+$-type drain layer 61 by selective etching, leaving n-type first semiconductor regions 62a. Then, p-type second semiconductor regions 62b are formed by epitaxially growing p-type layers in the trenches.

Thus, the vertical semiconductor device shown in FIG. 52, in that a current flows between the electrodes arranged on two major surfaces facing opposite to each other, has a laminate-type drift layer of alternating conductivity types formed of first semiconductor regions of a first conductivity type, that provide a current path in the ON-state of the semiconductor device and are depleted in the OFF-state of the semiconductor device, and second semiconductor regions of a second conductivity types.

Hereinafter, the semiconductor device including an alternating conductivity type drift layer will be referred to as the "super-junction semiconductor device".

In the super-junction semiconductor device, the tradeoff relation between the on-resistance $R_{ON}A$ and the breakdown voltage $V_B$ is expressed theoretically by the following relational expression (1).

$$R_{ON}A=(4dV_B)/(\mu_O\epsilon_S E_C^2) \qquad (1)$$

Here, $\mu$ is the electron mobility, $\epsilon_O$ the dielectric permeability of the vacuum, $\epsilon_S$ the relative dielectric permeability of silicon, d the width of the n-type drift region, and $E_C$ the critical electric field strength.

As the relational expression (1) indicates, the on-resistance of the super-junction semiconductor device increases merely in proportion to the breakdown voltage. When the breakdown voltage is raised, the on-resistance is not increased so greatly. The onresistance is reduced, at a fixed breakdown voltage, by narrowing the n-type first semiconductor regions.

A method of manufacturing a super-junction semiconductor device with an excellent mass-productivity is disclosed in Japanese Unexamined Laid Open Patent Application 2000-40822. According to the method disclosed in the above identified patent application, at least first semiconductor regions of the first conductivity type or second semiconductor regions of the second conductivity type are formed through one or more steps of epitaxial growth, one or more steps of ion implantation and one or more steps of heat treatment.

According to the method described above, however, an alternating conductivity type layer is formed by repeating the steps of epitaxial growth, ion implantation and heat treatment, and, then, the electrode means of the MOSFET are formed on the side of the first major surface and on the side of the second major surface. Since it is difficult for the method described above to conduct formation of the alternating conductivity type layer and to conduct formation of the device structure on the sides of the major surfaces individually, manufacturing steps are increased and complicated, causing manufacturing costs increase. Since it is indispensable to conduct heat treatment for forming the device structure on the side of the first major surface, the alternating conductivity type layer subjects to increasing times of heat treatment and, therefore, ideal characteristics for the alternating conductivity type layer are not obtained.

Corresponding to thickening the alternating conductivity type layer for obtaining a higher breakdown voltage, heat treatment is conducted more times, causing the problems described above more seriously. Therefore, the method described above has a certain limit for realizing a higher breakdown voltage.

In view of the foregoing, it is an object of the invention to provide a super-junction semiconductor device, that facilitates reducing times of heat treatment of the alternating conductivity type layer subjects, and preventing the characteristics of the alternating conductivity type layer from being impaired. It is another object of the invention to provide the method that facilitates manufacturing the super-junction semiconductor device with reduced costs and with an excellent mass-productivity without increasing times of heat treatment of the alternating conductivity type layer subjects, and without impairing the characteristics of the alternating conductivity type layer.

SUMMARY OF THE INVENTION

According to a first aspect of the invention, there is provided a method of manufacturing a super-junction semiconductor device, the semiconductor device including a semiconductor chip having a first major surface, a second major surface facing opposite to the first major surface, a device structure in the first major surface, and an alternating conductivity type layer between the first major surface and the second major surface, the alternating conductivity type layer being formed of first semiconductor regions of a first conductivity type and second semiconductor regions of a second conductivity type, the first semiconductor regions and the second semiconductor regions being arranged alternately with each other, the method including the steps of: forming at least a part of the first semiconductor regions or the second semiconductor regions from the side of the second major surface. The planar arrangement of the first semiconductor regions and the second semiconductor regions may be a stripe arrangement, a lattice arrangement or a net arrangement.

The manufacturing method according to the invention facilitates forming the alternating conductivity type layer and the surface device structure separately, simplifying the manufacturing steps, reducing the heat cycles, thereto the alternating conductivity type layer subjects, and preventing the characteristics of alternating conductivity type layer from being impaired. Since the device structure such as a surface MOSFET structure is formed first on the side of the first major surface and, then, trenches are formed and the trenches are buried from the side of the second major surface (the back surface), the alternating conductivity type layer is not subjected to excessive heat cycles and ideal pn-junctions are obtained. The method according to the invention facilitates manufacturing a semiconductor device, that greatly reduces the tradeoff relationship between the breakdown voltage and the on-resistance, with reduced manufacturing costs and with excellent mass-productivity.

Advantageously, the device structure includes a MIS structure, a pn-junction or a Schottky junction.

Advantageously, the method further includes the step of forming at least a part of the device structure prior to the steps of forming at least a part of the first semiconductor regions or the second semiconductor regions from the side of the second major surface. The manufacturing step order described above facilitates reducing the heat cycles, thereto the alternating conductivity type layer is subjected.

Advantageously, the steps of forming at least a part of the first semiconductor regions or the second semiconductor regions from the side of the second major surface include the step of forming trenches by selective etching and the step of burying the trenches by epitaxial growth. By employing selective etching for forming trenches and epitaxial growth for burying the trenches, the alternating conductivity type layer is formed easily from the side of the second major surface.

Preferably, the epitaxial growth is selective epitaxial growth or liquid phase epitaxial growth. The selective epitaxial growth or the liquid phase epitaxial growth facilitates obtaining an almost uniform and continuous impurity distribution in the depth direction as compared with the combination of epitaxial growth, ion implantation and heat treatment.

Preferably, the selective etching is anisotropic etching. The anisotropic etching facilitates easy formation of the trenches.

Advantageously, the steps of forming at least a part of the first semiconductor regions or the second semiconductor regions from the side of the second major surface include the step of selectively implanting impurity ions or repeating the step of selectively implanting and the step of heat treatment. This step combination, that introduces an impurity element by ion implantation, makes it unnecessary to form trenches and to bury the trenches, and greatly reduces the manufacturing steps. If the surface MOSFET is formed on the side of the first major surface, it will be enough to conduct minimum heat treatments for activating the implanted ions, since the ions are implanted from the side of the second major surface. Although a wave-shaped impurity distribution is caused, deviation of the impurity distribution is not caused in the depth direction.

Advantageously, the method further includes the step of polishing the semiconductor chip mechanically or chemically, prior to or after forming the alternating conductivity type layer, from the side of the second major surface so that the alternating conductivity type layer may have a predetermined thickness from the first major surface. Since it is necessary to adjust the thickness of the alternating conductivity type layer considering the designed breakdown voltage class, the polishing step is very effective in adjusting the thickness of the alternating conductivity type layer easily. If the semiconductor chip is adjusted at a desired thickness prior to forming the alternating conductivity type layer, the manufacturing efficiency will be improved.

Preferably, the first semiconductor regions or the second semiconductor regions are formed on the side of the second major surface by implanting impurity ions of the first conductivity type or the second conductivity type and thermally treating the ions. The combination of the ion implantation and the subsequent heat treatment facilitates forming a necessary electrode on the second major surface.

Preferably, the impurity concentration in the first semiconductor regions or the second semiconductor regions is $1 \times 10^{18}$ cm$^3$ or higher. When the impurity concentration in said regions is $1 \times 10^{18}$ cm$^3$ or higher, a satisfactory ohmic contact with the electrode on the second major surface is obtained.

According to a second aspect of the invention, there is provided a method of manufacturing a super-junction semiconductor device including an alternating conductivity type layer, the semiconductor device including a first semiconductor chip having a first major surface, and a device structure in the first major surface, and a second semiconductor chip having at least a part of the alternating conductivity type layer, the alternating conductivity type layer being formed of first semiconductor regions of a first conductivity type and second semiconductor regions of a second conductivity type, the first semiconductor regions and the second semiconductor regions being arranged alternately with each other, the method including the step of: connecting the first semiconductor chip and the second semiconductor chip with each other.

According to this manufacturing method, the semiconductor chip having the first major surface and the semiconductor chip having at least a part of the alternating conductivity type layer are manufactured separately, the heat cycles, thereto the alternating conductivity type layer subjects, are reduced, and an ideal alternating conductivity type layer is obtained.

Advantageously, the second semiconductor chip has a second major surface facing opposite to the first major surface, and a second main electrode on the second major surface.

Advantageously, the step of connecting includes the step of bonding the first semiconductor chip and the second semiconductor chip with each other.

Advantageously, the semiconductor device further includes a third semiconductor chip having at least another part of the alternating conductivity type layer, and the method includes the step of bonding the first semiconductor chip and the third semiconductor chip, and the step of bonding the third semiconductor chip and the second semiconductor chip.

Preferably, the bonding portions of the semiconductor chips are polished, oxide films are removed and the bonding steps are conducted at a predetermined temperature.

The super-junction semiconductor device including a plurality of semiconductor chips bonded with each other facilitates adjusting the thickness of the alternating conductivity type layer and, therefore, obtaining a desired breakdown voltage.

Advantageously, the first semiconductor regions or the second semiconductor regions are buried by epitaxial growth in the trenches formed by selective etching. Preferably, the epitaxial growth is selective epitaxial growth or liquid phase epitaxial growth. Preferably, the selective etching is anisotropic etching.

Advantageously, at least a part of the first semiconductor regions or at least a part of the second semiconductor regions is formed by selectively implanting impurity ions of the first conductivity type or the second conductivity type one or more times and thermally treating the ions.

Advantageously, the bottom face of each of the trenches is a (110) plane or a (100) plane of silicon and the side face of each of the trenches is a (111) plane of silicon.

Since silicon crystal grows faster in the [110] direction or in the [100] direction than in the [111] direction, the trenches are buried without causing any void even when the aspect ratio of the trenches is large.

According to a third aspect of the invention, there is provided a semiconductor device including: a semiconductor chip; the semiconductor chip including a first major surface; a second major surface facing opposite to the first major surface; an alternating conductivity type layer between the first major surface and the second major surface, the alternating conductivity type layer being formed of drift regions of a first conductivity type and second semiconductor regions of a second conductivity type, the first semiconductor regions and the second semiconductor regions being alternately arranged with each other, at least a part of the first semiconductor regions or a part of the second semiconductor regions being formed from the side of the second major surface; well regions of the second conductivity type on the side of the first major surface; source regions of the first conductivity type, the source regions being separated from the first semiconductor regions by the well regions; gate electrodes above the surfaces of the well regions contacting with the source regions with respective gate insulation films interposed between the gate electrodes and the surfaces of the well regions; the well regions being shaped with respective stripes extending in parallel with a first spacing left therebetween; and the second semiconductor regions being shaped with respective stripes extending in parallel with a second spacing left therebetween.

According to a fourth aspect of the invention, there is provided a super-junction semiconductor device including an alternating conductivity type layer, the alternating conductivity type layer including first semiconductor regions of a first conductivity type and second semiconductor regions of a second conductivity type, the first semiconductor regions and the second semiconductor regions being alternately arranged with each other, the semiconductor device including: a first semiconductor chip including a first major surface a second semiconductor chip including a second major surface facing opposite to the first major surface, a second main electrode on the second major surface, and at least a part of the alternating conductivity type layer; a connecting portion between the first semiconductor chip and the second semiconductor chip; the first semiconductor chip including well regions of the second conductivity type on the side of the first major surface, source regions of the first conductivity type, the source regions being separated from the first semiconductor regions by the well regions, and gate electrodes above the surfaces of the well regions contacting with the source regions with respective gate insulation films interposed between the gate electrodes and the surfaces of the well regions; the well regions being shaped with respective stripes extending in parallel with a first spacing left therebetween; and the second semiconductor regions being shaped with respective stripes extending in parallel with a second spacing left therebetween.

Advantageously, the bonding portion is a bonding plane or a third semiconductor chip including at least another part of the alternating conductivity type layer.

Advantageously, the semiconductor device further includes surface drain regions of the first conductivity type between the well regions, the surface drain regions including a portion, the net impurity concentration thereof being higher than the impurity concentration in the first semiconductor regions.

Advantageously, the first semiconductor regions are shaped with respective stripes extending in parallel to each other with a certain spacing left therebetween.

Advantageously, the gate electrodes are shaped with respective stripes extending in parallel to each other with a certain spacing left therebetween.

Advantageously, the extending direction of the stripes of the well regions and the extending direction of the stripes of the second semiconductor regions are different from each other. Preferably, the stripes of the well regions and the stripes of the second semiconductor regions extend in perpendicular to each other.

Since the surface JFET effect is reduced as far as the net impurity concentrations are high in a portion of the surface drain region, the configurations described above facilitate reducing the on-resistance. When the stripes of the well regions and the stripes of the second semiconductor regions are almost perpendicular to each other, it is not necessary to precisely position the surface MOSFET structure and the alternating conductivity type layer with each other, and, therefore, a semiconductor device exhibiting an excellent performance is manufactured easily.

BRIEF DESCRIPTION OF THE DRAWING FIGURES

FIG. 8($b$) shows an impurity distribution profile in the cross section B–B' of FIG. 7.

FIG. 8($c$) shows an impurity distribution profile in the cross section C–C' of FIG. 7.

FIG. 14($b$) shows an impurity distribution profile in the cross section B–B' of FIG. 13.

FIG. 14($c$) shows an impurity distribution profile in the cross section C–C' of FIG. 13.

FIG. 21($b$) shows an impurity distribution profile in the cross section B–B' of FIG. 20.

FIG. 21($c$) shows an impurity distribution profile in the cross section C–C' of FIG. 20.

FIG. 33($b$) shows an impurity distribution profile in the cross section B–B' of FIG. 32.

FIG. 33($c$) shows an impurity distribution profile in the cross section C–C' of FIG. 32.

FIG. 39($b$) shows an impurity distribution profile in the cross section B–B' of FIG. 38.

FIG. 39($c$) shows an impurity distribution profile in the cross section C–C' of FIG. 38.

FIG. 46($b$) shows an impurity distribution profile in the cross section B–B' of FIG. 45.

FIG. 46($c$) shows an impurity distribution profile in the cross section C–C' of FIG. 45.

Figure 52:
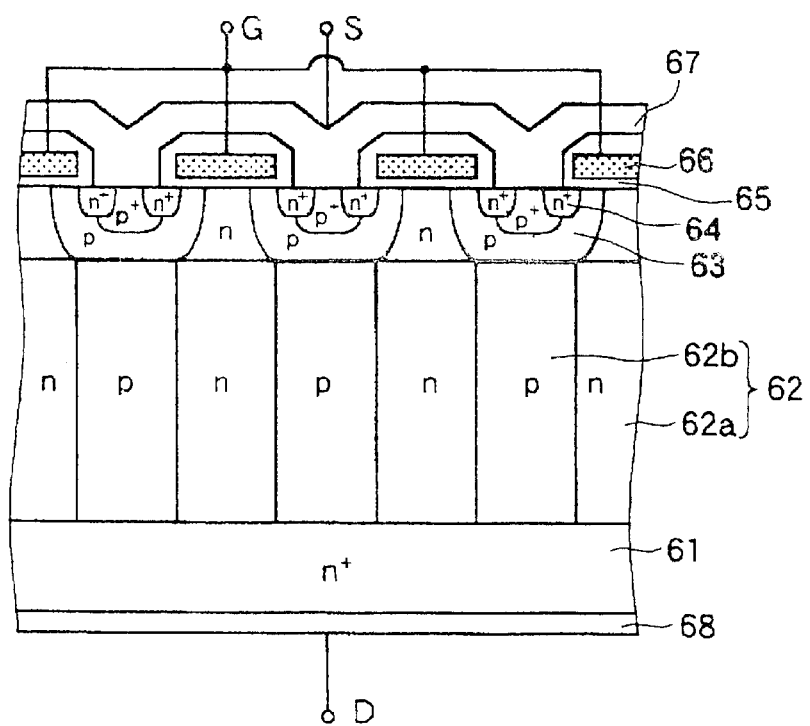

FIG. 52 is a cross-sectional view of the vertical MOSFET disclosed in U.S. Pat. No. 5,216,275.

PREFERRED EMBODIMENTS OF THE INVENTION

Now the present invention will be described hereinafter with reference to the accompanied drawing figures which illustrate the preferred embodiments of the invention. In the following, the n-type layer or the n-type region is a layer or a region, in that electrons are the majority carriers. The p-type layer or the p-type region is a layer or a region, in that holes are the majority carriers. The $n^+$-type region or the $p^+$-type region is a region doped relatively heavily. The n-type region or the p-type region is a region doped relatively lightly. In some drawing figures, electrodes on a first major surface or an electrode on a second major surface, and an anode layer with low electrical resistance in contact with the electrodes on the first major surface or a cathode layer with low electrical resistance in contact with the electrode on the second major surface are omitted. In the following drawing figures, the same or the like reference numerals are used to designate the same or the like constituent elements.

First Embodiment

Figure 1:
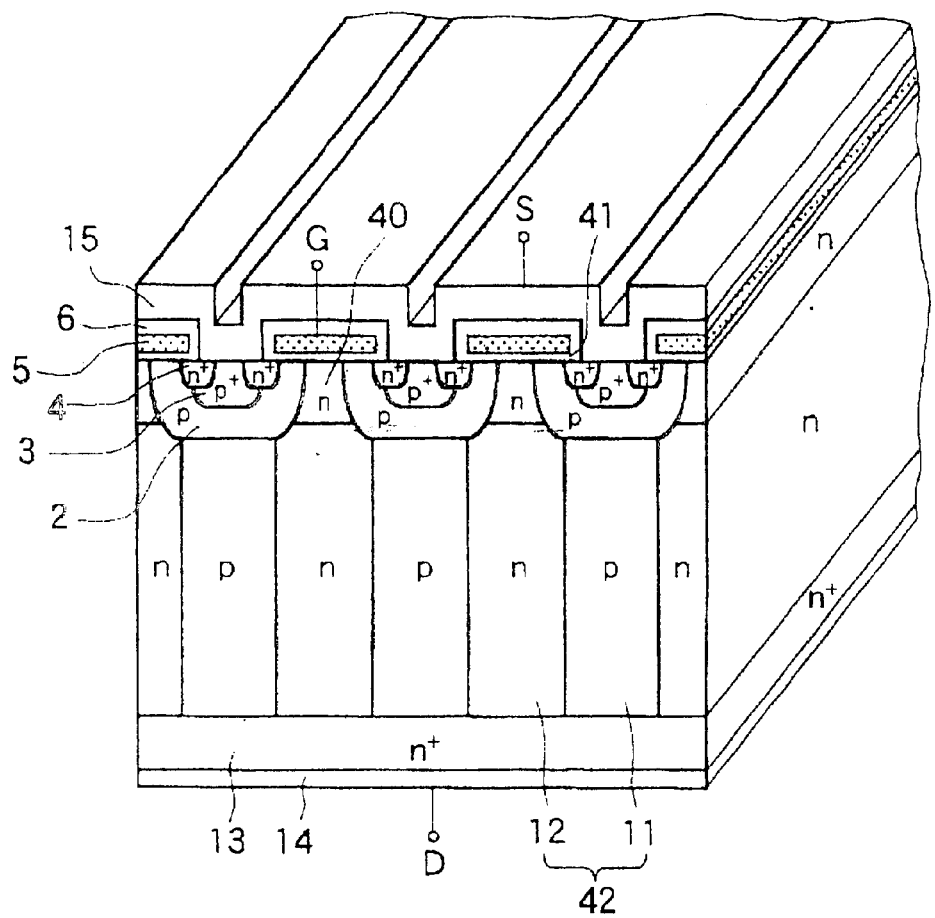
FIG. 1 is a perspective cross sectional view of a vertical super-junction MOSFET according to the first embodiment of the invention.

First, the structure of a vertical super-junction MOSFET according to a first embodiment of the invention will be described. FIG. 1 is a perspective cross-sectional view of a vertical super-junction MOSFET according to a first embodiment of the invention. In FIG. 1, an $n^+$-type drain layer 13, n-type drift regions 12 and p-type partition regions 11 are shown. The n-type drift regions 12 and p-type partition regions 11 constitute a semiconductor core region 42.

In the surface portion of semiconductor core region 42, an n-channel layer 40 as a surface drift region is formed in contact with n-type drift region 12, and a p-type base region 2 is formed in contact with p-type partition region 11. An $n^+$-type source region 4 and a heavily doped $p^+$-type contact region 3 are in p-type base region 2. A gate electrode layer 5 is above the extended portion of p-type base region 2 extended between $n^+$-type source region 4 and n-channel layer 40 with a gate insulation film 41 interposed therebetween. A source electrode 15 is formed in contact commonly with $n^+$-type source region 4 and $p^+$-type contact region 3. A drain electrode 14 is arranged on the back surface of $n^+$-type drain layer 13. In many cases, source electrode 15 is extended above gate electrode layer 5 with an interlayer insulation film 6 interposed therebetween. Although a drift current flows through n-type drift regions 12 in semiconductor core region 42 formed of p-type partition regions 11 and n-type drift regions 12, the semiconductor core region including p-type partition regions will be collectively referred to hereinafter as the "drift layer".

The vertical super-junction MOSFET shown in FIG. 1 operates in the following manner. When a predetermined positive voltage is applied to gate electrode layer 5, an inversion layer is created in the surface portion of p-type base region 2 beneath gate electrode layer 5. Electrons are injected from $n^+$-type source regions 4 to n-channel layers 40 via the inversion layers. The injected electrons reach $n^+$-type drain layer 13 via n-type drift regions 12, electrically connecting drain electrode 14 and source electrode 15 with each other.

When the positive voltage is removed from gate electrode layer 5, the inversion layer in the surface portion of p-type base region vanishes, electrically disconnecting the drain D and the source S from each other. As the reverse bias voltage is further raised, depletion layers expand from pn-junctions between p-type base regions 2 and n-channel layers 40 and from pn-junctions between n-type drift regions 12 and p-type partition regions 11 into n-type drift regions 12 and p-type partition regions 11, depleting n-type drift regions 12 and p-type partition regions 11.

Since the edges of the depletion layers expanding from the pn-junctions between n-type drift regions 12 and p-type partition regions 11 advance in the width direction of n-type drift regions 12 from the adjacent p-type partition regions 11 on both sides, n-type drift regions 12 are depleted very quickly. Therefore, n-type drift regions 12 can be doped heavily. The p-type partition regions 11 are also depleted simultaneously. Since depletion layers expand into p-type partition regions 11 from both side faces thereof, p-type partition regions 11 are also depleted very quickly. Since p-type partition regions 11 and n-type drift regions 12 are arranged alternately with each other to expand depletion layers into adjacent n-type drift regions 12 from partition region 11, the total area occupied by p-type partition regions 11 for forming depletion layers may be halved, and the cross section of n-type drift regions 12 may be widened corresponding to the reduced area of p-type partition regions 11.

The dimensions of the constituent elements and the impurity concentrations therein of a MOSFET of the 300 V class are as follows. The specific resistance of $n^+$-type drain layer 13 is 0.01 Ω cm. The thickness of $n^+$-type drain layer 13 is 350 μm. The thickness of drift layer 42 formed of p-type partition regions 11 and n-type drift regions 12 is 25 μm. The width of p-type partition region 11 and the width of n-type drift region 12 are the same 5 μm (that is, the spacing between the centers of the regions of the same conductivity type is 10 μm). The average impurity concentration in p-type partitions region 11 and n-type drift regions 12 is $7\times10^{15}$ $cm^3$. The diffusion depth of p-type base region 2 is 3 μm. The surface impurity concentration in p-type base region 2 is $3\times10^{17}$ $cm^3$. The diffusion depth of $n^+$-type source region 4 is 0.3 μm. The surface impurity concentration in $n^+$-type source region 4 is $1\times10^{20}$ $cm^3$.

For providing the conventional vertical MOSFET including a single-layered highly-resistive drift layer with a breakdown voltage of the 300 V class, the impurity concentration of $2\times10^{14}$ $cm^3$ and the thickness of 40 μm are required for n-type drift layer 52. In contrast, since n-type drift regions 12 are heavily doped and the thickness of drift layer 42 is reduced corresponding to the heavy doping, the on-resistance of the vertical super-junction MOSFET according to the first embodiment is reduced to ⅕ of the on-resistance of the conventional vertical MOSFET.

By further narrowing n-type drift regions 12 and by further increasing the impurity concentration in n-type drift regions 12, the on-resistance and the tradeoff relationship between the on-resistance and the breakdown voltage are further reduced. The super-junction MOSFET according to the first embodiment of the invention is different from the conventional super-junction MOSFET shown in FIG. 52 in the way of forming drift layer 42 (that is, the way of forming p-type partition regions 11 and n-type drift regions 12) and the resulting drift layer structure. More in detail, since n-type drift regions 12 and p-type partition regions 11 are formed by diffusing respective impurity ions, impurity concentration distributions are caused in drift layer 42.

Now the manufacturing methods and the structures of the super-junction MOSFET according to the invention will be described more in detail below.

Second Embodiment

First, a method of manufacturing a super-junction MOSFET according to a second embodiment of the invention will be described. FIGS. 2 through 7 are cross-sectional views for explaining the steps of manufacturing a super-junction MOSFET according to a second embodiment of the invention.

Figure 2:
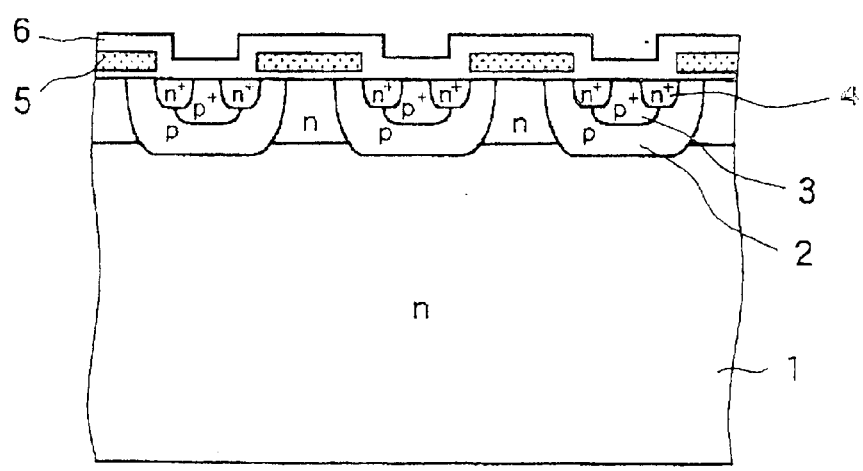
FIGS. 2 through 7 are cross sectional views for explaining the steps of manufacturing a super-junction MOSFET according to the second embodiment of the invention.

Referring first to FIG. 2, the usual double-diffusion MOSFET manufacturing process is conducted. P-type base regions 2 are formed selectively in the surface portion of an n-type semiconductor substrate 1. A heavily doped p$^+$-type contact region 3 and a heavily doped n$^+$-type source region 4 are formed selectively in p-type base regions 2. Polysilicon gate electrode layers 5 are formed above the extended portions of p-type base regions 2 extended between n$^+$-type source regions 4 and semiconductor substrate 1 with gate insulation films interposed therebetween. An interlayer insulation film 6 is deposited on gate electrode layers 5. Then, semiconductor substrate 1 is polished mechanically from the back surface thereof until semiconductor substrate 1 has a predetermined thickness.

Figure 3:
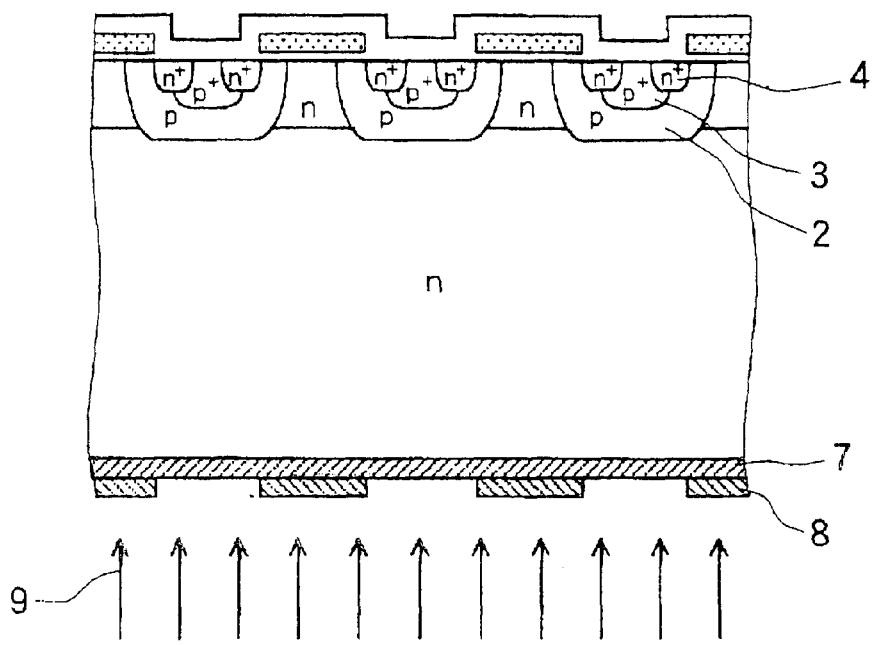

Referring now to FIG. 3, an oxide film 7 is deposited by the CVD method on the polished back surface of semiconductor substrate 1. A resist mask 8, having windows for forming p-type partition regions, is formed by photolithography. Oxide film 7 is etched with etching ions.

Figure 4:
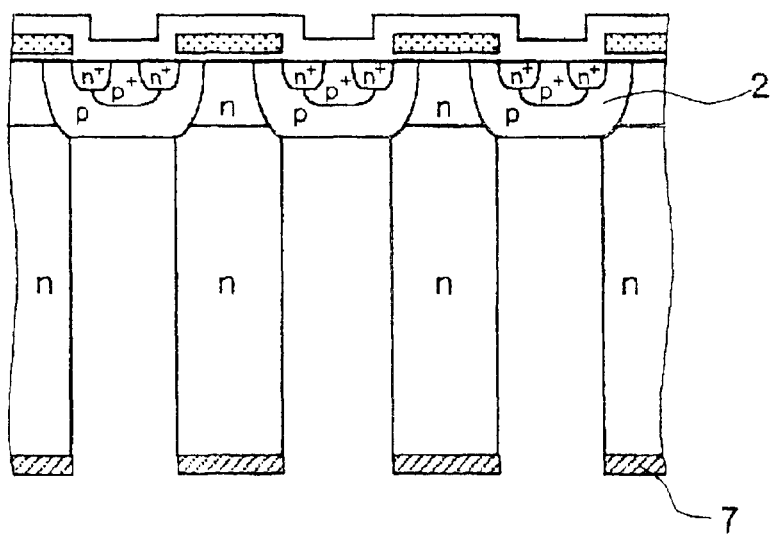

Referring now to FIG. 4, resist mask 8 is removed. Trenches are dug down to p-type base regions 2 by anisotropic etching of silicon, typically by the RIE method (reactive ion etching), using oxide film 7 as a mask.

Figure 5:
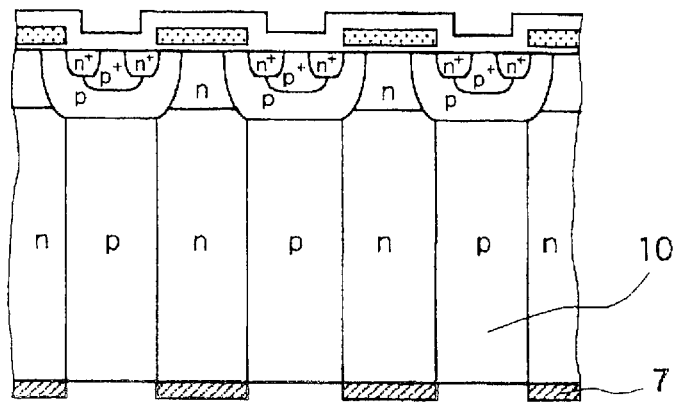

Referring now to FIG. 5, epitaxial layers doped with a p-type impurity (p-type epitaxial layers) 10 are buried in the trenches by the selective epitaxial growth technique (at a low temperature, under a reduced pressure and using a gas mixture of HCl and raw material gases), which utilizes the fact that any Si single crystal does not grow on oxide film 7, or by the liquid phase epitaxial growth technique (using molten Sn containing Si and a p-type impurity such as boron). Then, oxide film 7 is removed.

Figure 6:
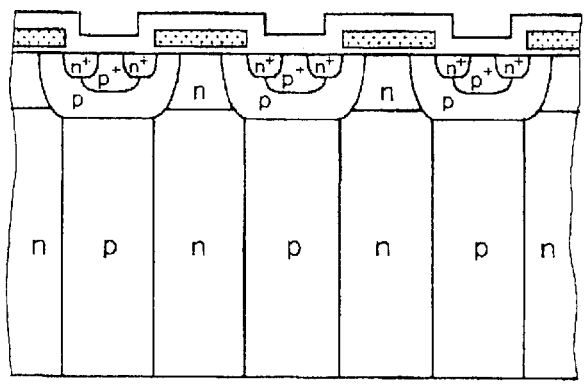

Referring now to FIG. 6, the back surfaces of the remaining n-type regions and the as grown p-type epitaxial layers 10 are polished mechanically or chemically to obtain a flat back surface.

Figure 7:
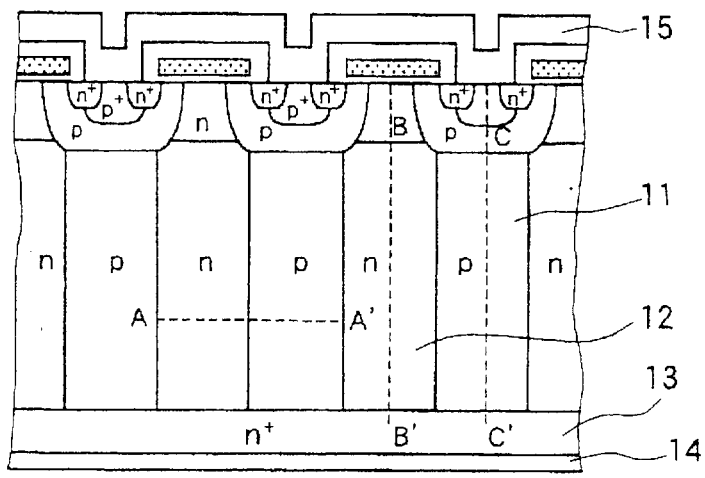

Referring now to FIG. 7, an n$^+$-type drain layer 13 is formed on the back surface by introducing an n-type impurity in the entire back surface portion and by thermally activating the introduced n-type impurity. Then, returning back to the usual MOSFET manufacturing process, contact holes are bored, a source electrode 15 is formed, a passivation film is deposited, and a drain electrode is formed by vacuum deposition.

Since the remaining n-type semiconductor substrate 1 turns into n-type drift regions 12, it is preferable to dope n-type semiconductor substrate 1 in advance at the impurity concentration roughly determined by the width of n-type drift region 12 and the width of p-type partition region 11. For example, when n-type drift region 12 and p-type partition region 11 are the same 8m in width, the preferable impurity concentration in the regions 12 and 11 is around $2 \times 10^{15}$ cm$^3$. Since the breakdown voltage is proportional to the thickness of the alternating conductivity type layer (drift layer 42), the thickness thereof should be determined on basis of the designed breakdown voltage class. For example, it is enough for the alternating conductivity type layer to be 50 μm in thickness for the breakdown voltage of the 600 V class.

The trenches are buried easily by using molten Sn, which exhibits an excellent wettability to silicon and easily causes a capillary phenomenon due to the surface tension thereof. Even when the aspect ratio of the trenches is large, the trenches are buried easily without causing any void therein by making the bottom face of the trenches coincide with a (110) plane or a (100) plane of silicon and the side face of the trenches with a (111) plane of silicon so that silicon may grow faster on the trench bottom face than on the trench side face. The principles described above is applied also to burying the trenches in the following embodiments.

Figure 8A:
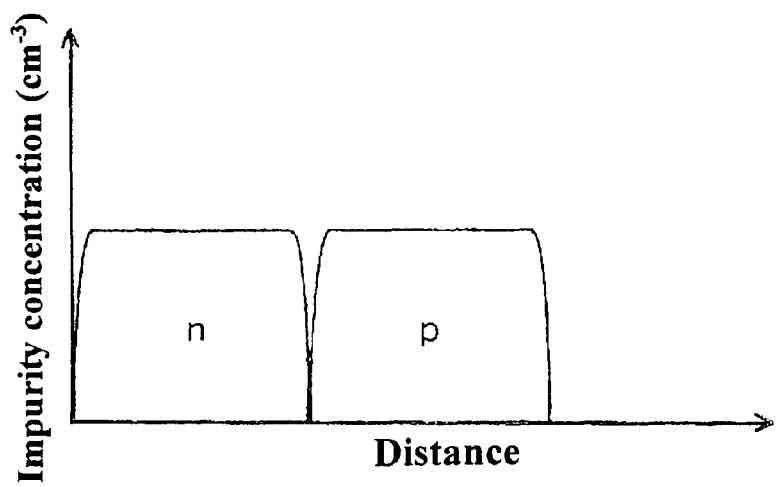
FIG. 8($a$) shows an impurity distribution profile in the cross section A–A' of FIG. 7.
Figure 8B:
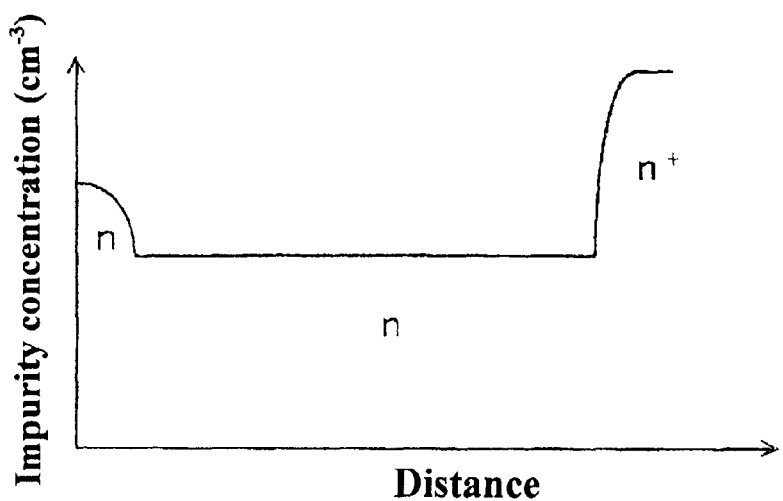
Figure 8C:
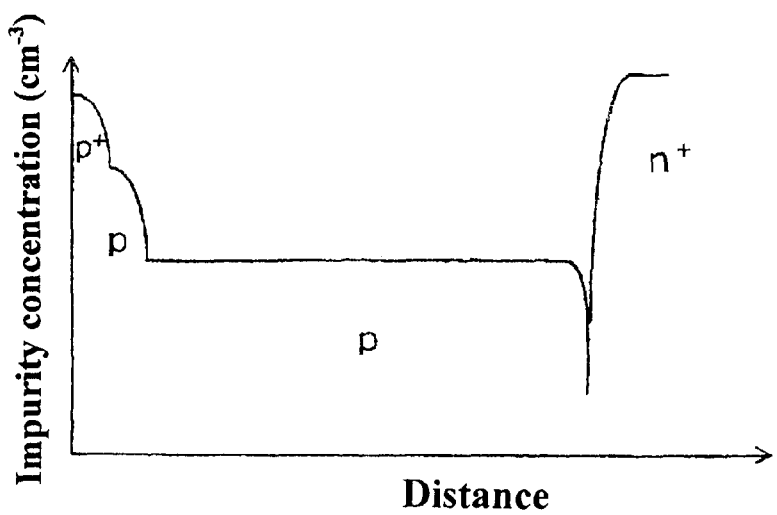

FIG. 8(a) shows an impurity distribution profile in the cross section A–A' of FIG. 7. FIG. 8(b) shows an impurity distribution profile in the cross section B–B' of FIG. 7. FIG. 8(c) shows an impurity distribution profile in the cross section C–C' of FIG. 7. In these figures, the horizontal axis represents the distance in each cross section and the vertical axis the impurity concentration in a unit volume (cm$^3$). As FIG. 8(a) shows, impurity distributions in n-type drift region 12 and p-type partition region 11 are uniform across the respective regions 12 and 11

As shown in FIGS. 8(b) and 8(c), the impurities distribute uniformly in the depth directions of n-type drift regions 12 and p-type partition regions 11, resulting in ideal pn-junctions therebetween, since any thermal hysteresis is not caused in forming the MOSFET structure in the surface portion and since the alternating conductivity type layer (drift layer 42) is formed from the back surface side by the epitaxial growth techniques at low temperatures. The manufacturing method according to the second embodiment is suitable for forming fine structures, since the manufacturing method according to the second embodiment hardly causes impurity concentration variations by the compensation effects. According to the second embodiment, p-type partition regions 11 are formed by employing the burying technique. Alternatively, n-type drift regions 12 may be formed by employing the burying technique.

Third Embodiment

Figure 9:
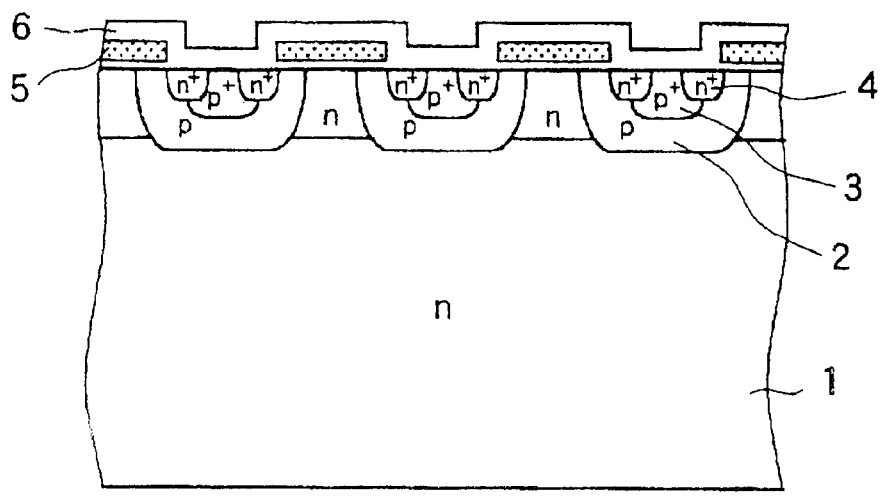
FIGS. 9 through 13 are cross sectional views for explaining the steps of manufacturing a super-junction MOSFET according to the third embodiment of the invention.
Figure 10:
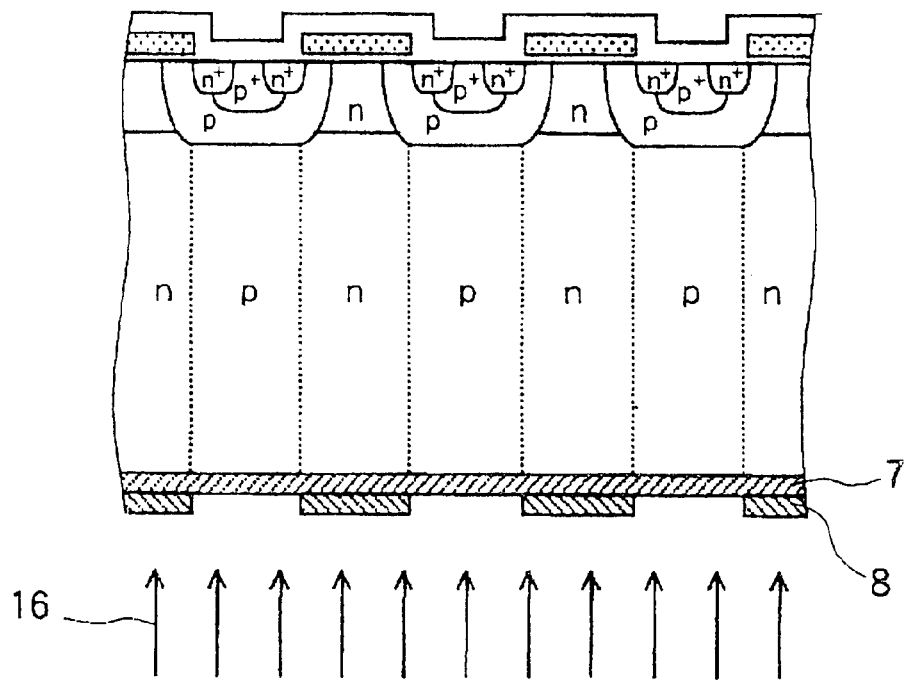
Figure 11:
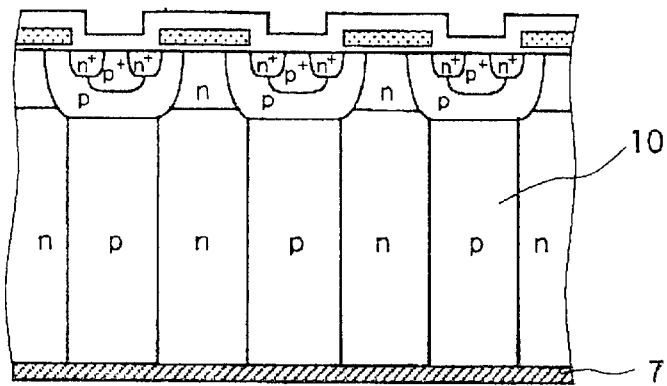
Figure 12:
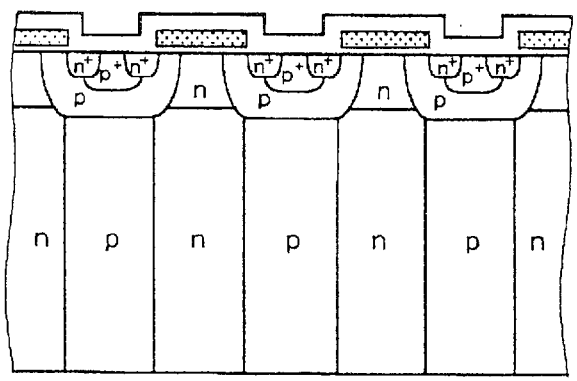
Figure 13:
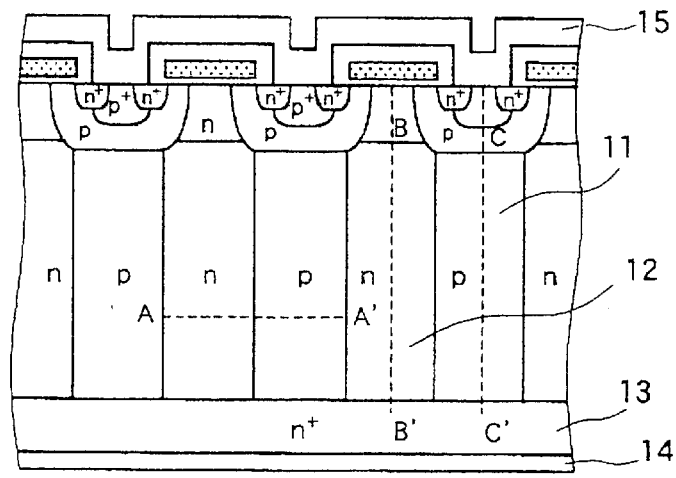

Now, a method of manufacturing a super-junction MOSFET according to a third embodiment of the invention will be described. FIGS. 9 through 13 are cross-sectional views for explaining the steps of manufacturing a super-junction MOSFET according to a third embodiment of the invention. The manufacturing method according to the third embodiment is different from the manufacturing method according to the second embodiment in that p-type partition regions 11 are formed by implanting boron ions at a high energy and by thermally driving the implanted boron ions according to the third embodiment. Therefore, the manufacturing steps shown in FIGS. 10 and 11 are different from the manufacturing steps according to the second embodiment, and the steps shown in FIGS. 9, 12 and 13 are the same with the corresponding manufacturing steps according to the second embodiment. In the following, the different steps will be described and the duplicated descriptions of the same steps will be omitted for the sake of simplicity.

In place of the steps of trench formation shown in FIGS. 3 and 4 and the step of burying the trenches with the p-type layers shown in FIG. 5, boron ions 16 are implanted at a high energy in the step shown in FIG. 10 and p-type epitaxial layers 10 are formed by heat treatment in the step shown in FIG. 11. Due to this replacement, the manufacturing steps are reduced greatly as compared with the manufacturing steps according to the second embodiment. The heat treatment of the implanted boron ions is conducted at around 1000° C., at that the compensation caused by the thermal diffusion may be suppressed at a small amount.

Figure 14A:
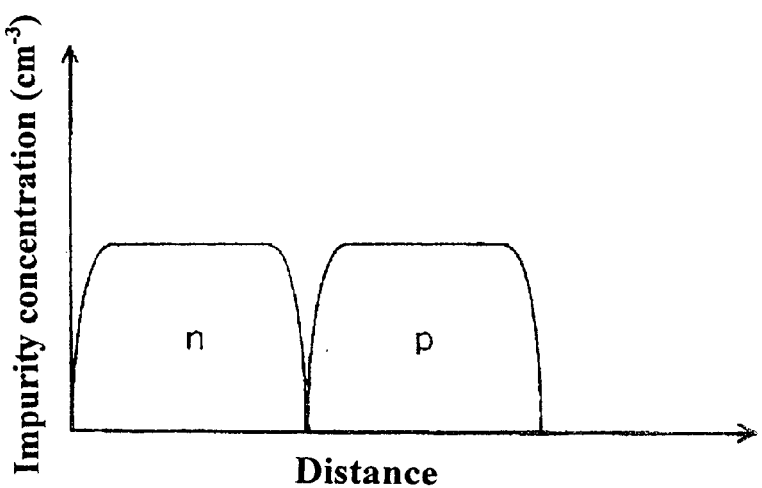
FIG. 14($a$) shows an impurity distribution profile in the cross section A–A' of FIG. 13.
Figure 14B:
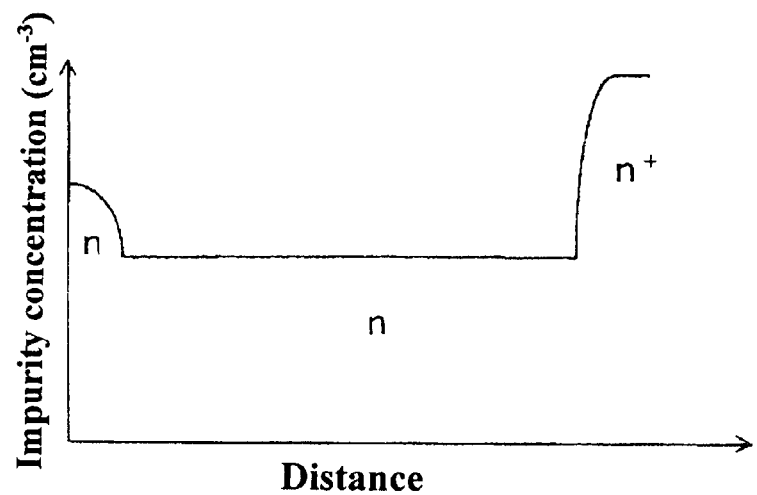
Figure 14C:
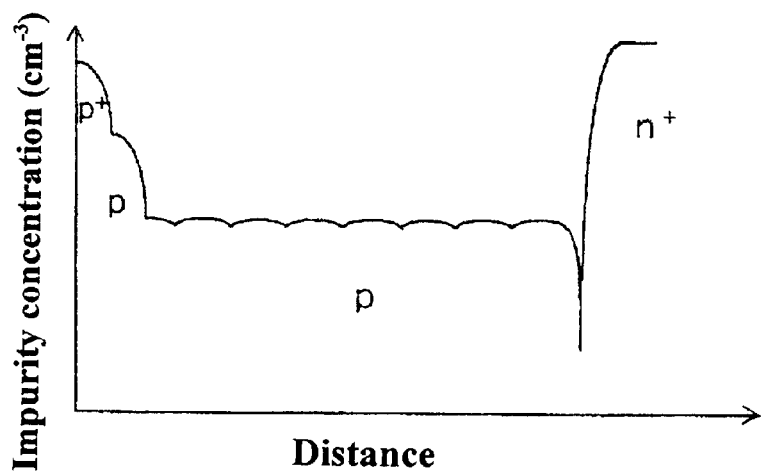

FIG. 14(a) shows an impurity distribution profile in the cross section A–A' of FIG. 13. FIG. 14(b) shows an impurity distribution profile in the cross section B–B' of FIG. 13. FIG. 14(c) shows an impurity distribution profile in the cross section C–C' of FIG. 13. As shown in FIG. 14(b), the impurity distribution in n-type drift regions 12 is uniform in the depth direction thereof, since n-type drift region 12 is a part of n-type semiconductor substrate 1. As shown in FIG. 14(c), a wave-shaped vertical impurity distribution profile is caused in p-type partition region 11, since p-type partition regions 11 are formed by implanting boron ions 16 and by thermally driving the implanted boron ions. However, since the heat treatment is conducted after implanting boron ions into multiple locations spaced apart for a certain distance vertically from each other, vertical deviation of the impurity concentration is not caused.

By continuously changing the acceleration voltage (energy) for implanting boron ions 16, an almost uniform impurity concentration profile is obtained. Since the boundary regions between the regions 11 and 12 are not affected so much by the thermal diffusion, the pn-junctions formed between n-type drift regions 12 and p-type partition regions 11 according to the third embodiment are close to the ideal ones. The impurity concentration in p-type partition regions 11 is controlled accurately due to the employed boron ion implantation. The p-type partition regions 11 may be narrowed by changing the surface areas (mask windows), through which boron ions 16 are implanted. According to the third embodiment, p-type partition regions 11 are formed by employing boron ion implantation. Alternatively, n-type drift regions 12 may be formed by implanting phosphorus ions or arsenic ions.

Fourth Embodiment

Figure 16:
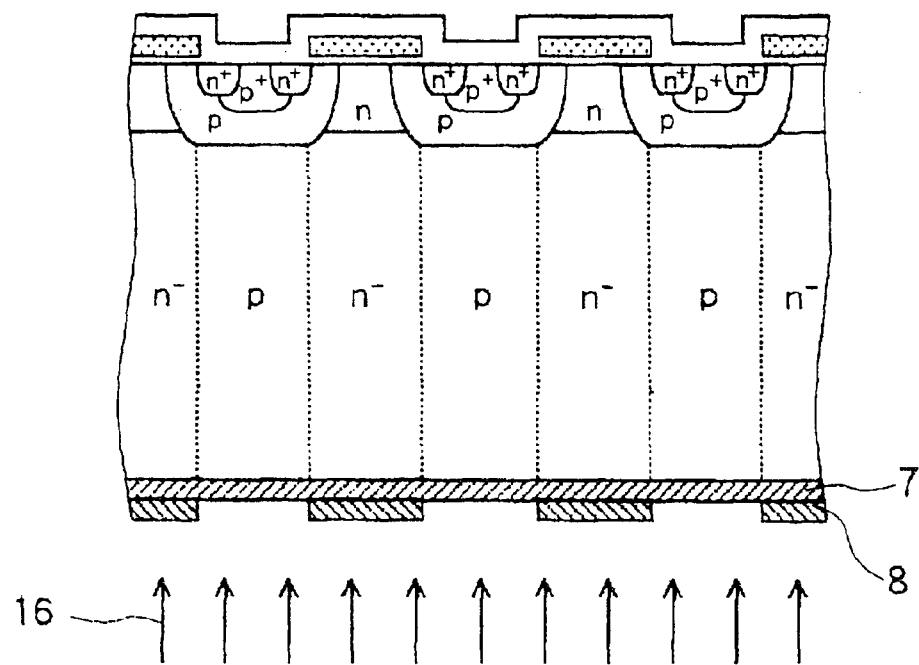
Figure 17:
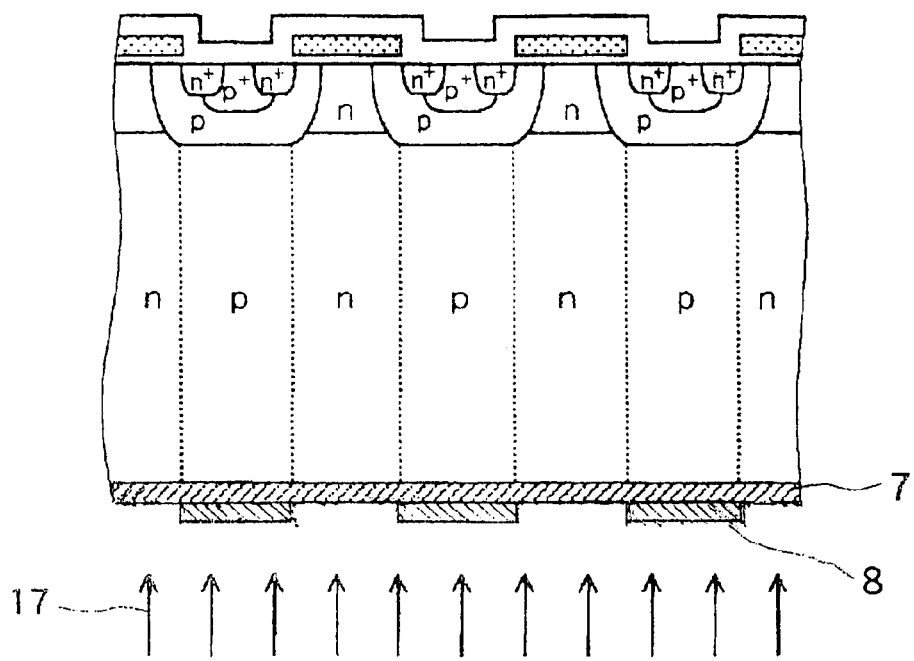

Now, a method of manufacturing a super-junction MOSFET according to a fourth embodiment of the invention will be described. FIGS. 15 through 20 are cross-sectional views for explaining the steps of manufacturing a super-junction MOSFET according to a fourth embodiment of the invention. The manufacturing method according to the fourth embodiment is different from the manufacturing method according to the third embodiment in that p-type partition regions 11 and n-type drift regions are formed, after forming a MOSFET structure on an n-type highly resistive substrate, by implanting boron ions and phosphorus ions, respectively, from the back surface of the substrate under high acceleration voltages and by thermally driving the implanted ions according to the fourth embodiment. Therefore, the step of implanting phosphorus ions 17 shown in FIG. 17 is added to the manufacturing steps according to the third embodiment.

Figure 15:
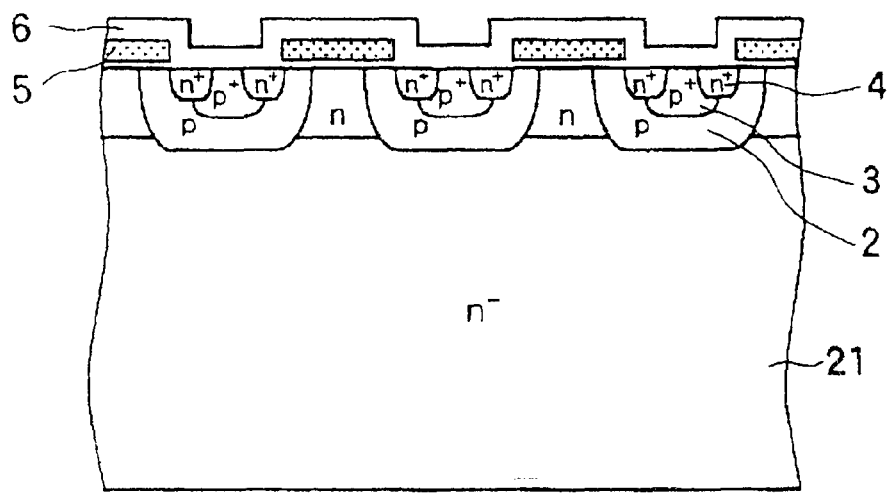
FIGS. 15 through 20 are cross sectional views for explaining the steps of manufacturing a super-junction MOSFET according to the fourth embodiment of the invention.
Figure 18:
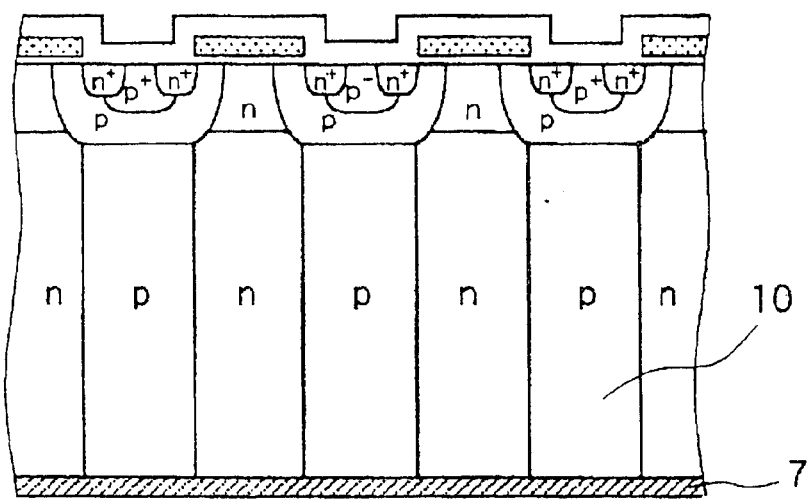
Figure 19:
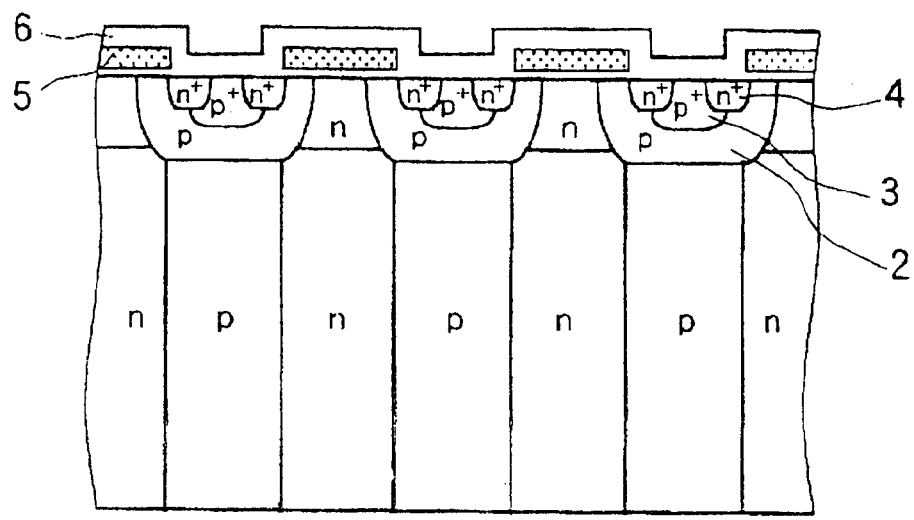

Referring now to FIG. 15, a MOSFET structure is formed in the surface portion of an n-type semiconductor substrate 21 used in substitution for n-type semiconductor substrate 1. Referring now to FIG. 16, boron ions 16 are implanted at a high energy from the back surface of n-type semiconductor substrate 21. Referring now to FIG. 17, phosphorus ions 17 are implanted at a high energy from the back surface of n-type semiconductor substrate 21. Referring now to FIG. 18, p-type epitaxial layers 10 are formed by heat treatment. Since p-type partition regions 11 and n-type drift regions 12 are formed by implanting boron and phosphorus ions at high energies and by thermally treating the implanted regions at around 1000° C. to activate the implanted ions, the manufacturing method according to the fourth embodiment facilitates controlling the impurity concentrations.

Figure 20:
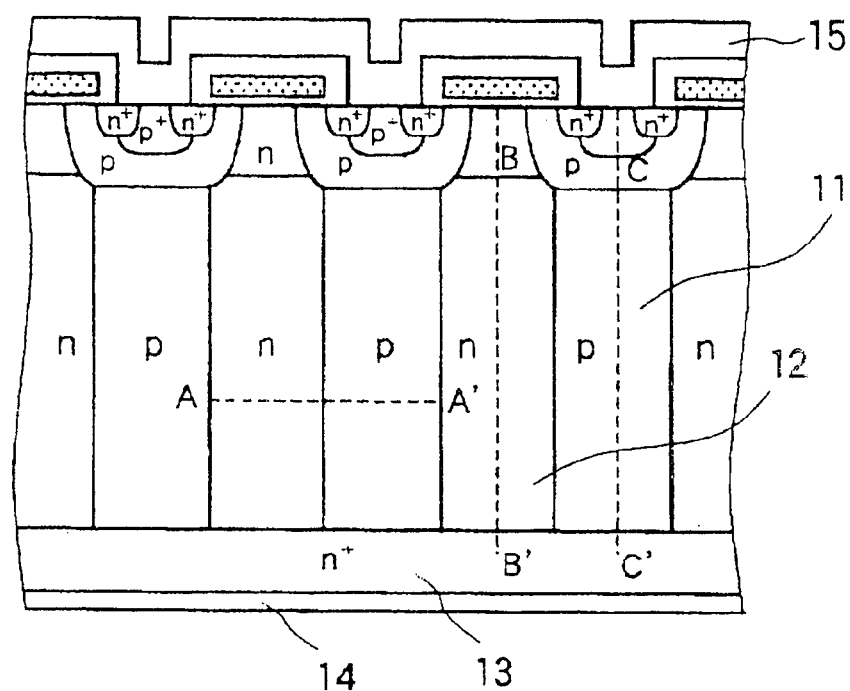
Figure 21A:
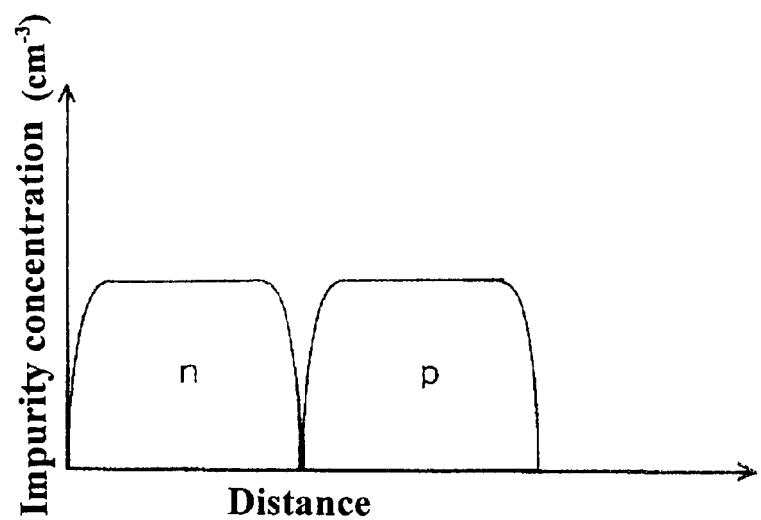
FIG. 21($a$) shows an impurity distribution profile in the cross section A–A' of FIG. 20.
Figure 21B:
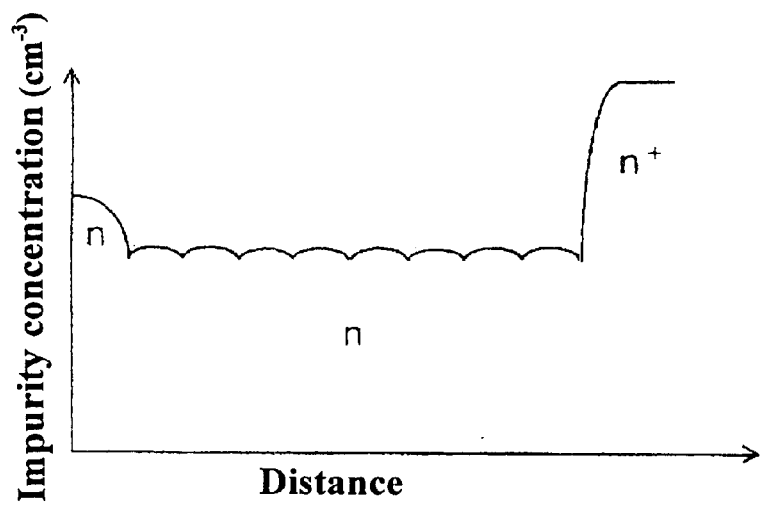
Figure 21C:
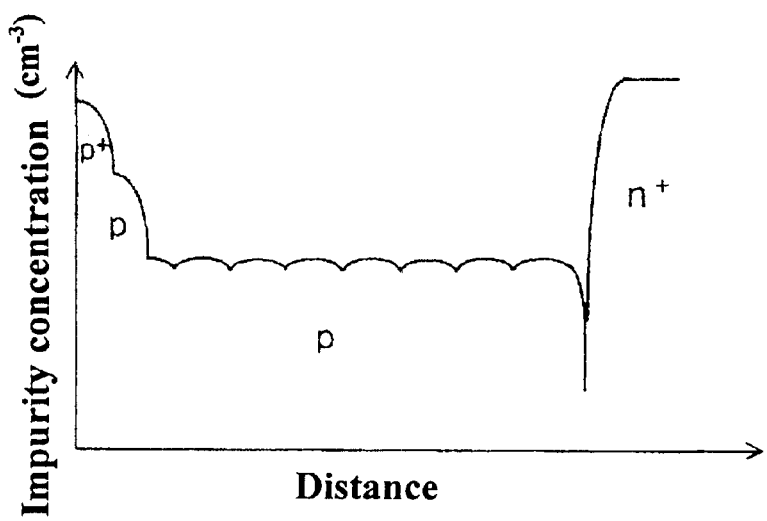

FIG. 21(a) shows an impurity distribution profile in the cross section A–A' of FIG. 20. FIG. 21(b) shows an impurity distribution profile in the cross section B–B' of FIG. 20. FIG. 21(c) shows an impurity distribution profile in the cross section C–C' of FIG. 20. As shown in FIGS. 21(b) and 21(c), wave-shaped vertical impurity distribution profiles are caused in n-type drift regions 12 and p-type partition regions 11, since p-type partition regions 11 and n-type drift regions 12 are formed by implanting boron ions 16 and phosphorus ions 17 and by thermally driving the implanted ions. However, any vertical deviation of the impurity concentration is not caused in the regions 11 and 12. Since the boundary regions between the regions 11 and 12 are not affected so much by the thermal difflusion, the pn-junctions formed between n-type drift regions 12 and p-type partition regions 11 according to the fourth embodiment are close to the ideal ones.

Figure 22:
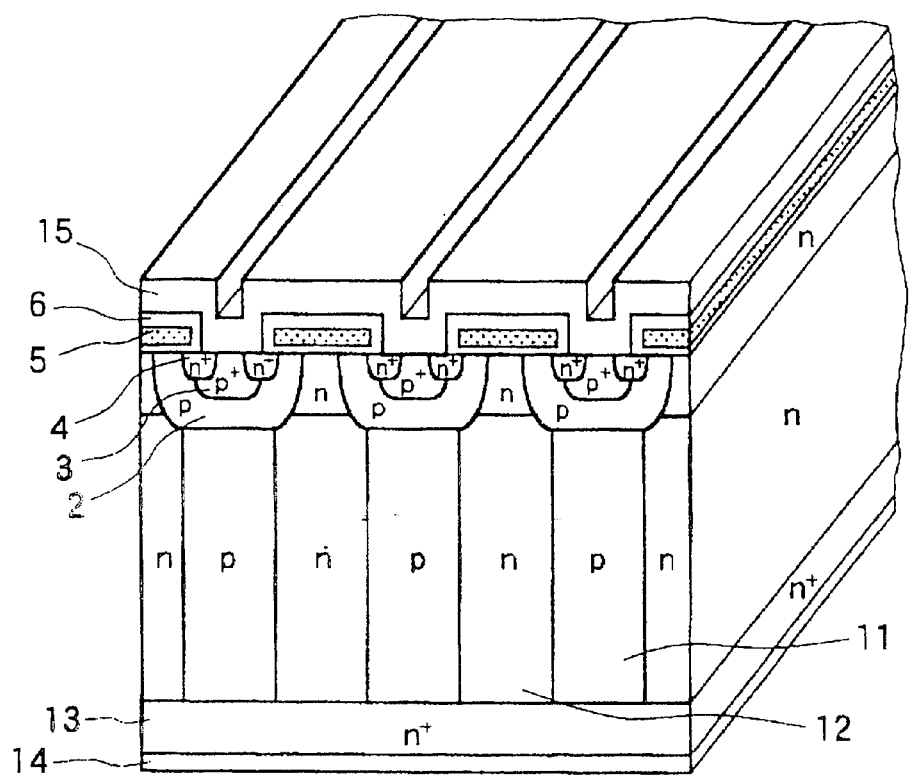
FIG. 22 is a perspective cross-sectional view of a vertical super-junction MOSFET manufactured by the manufacturing method according to any of the second through fourth embodiments of the invention.
Figure 23:
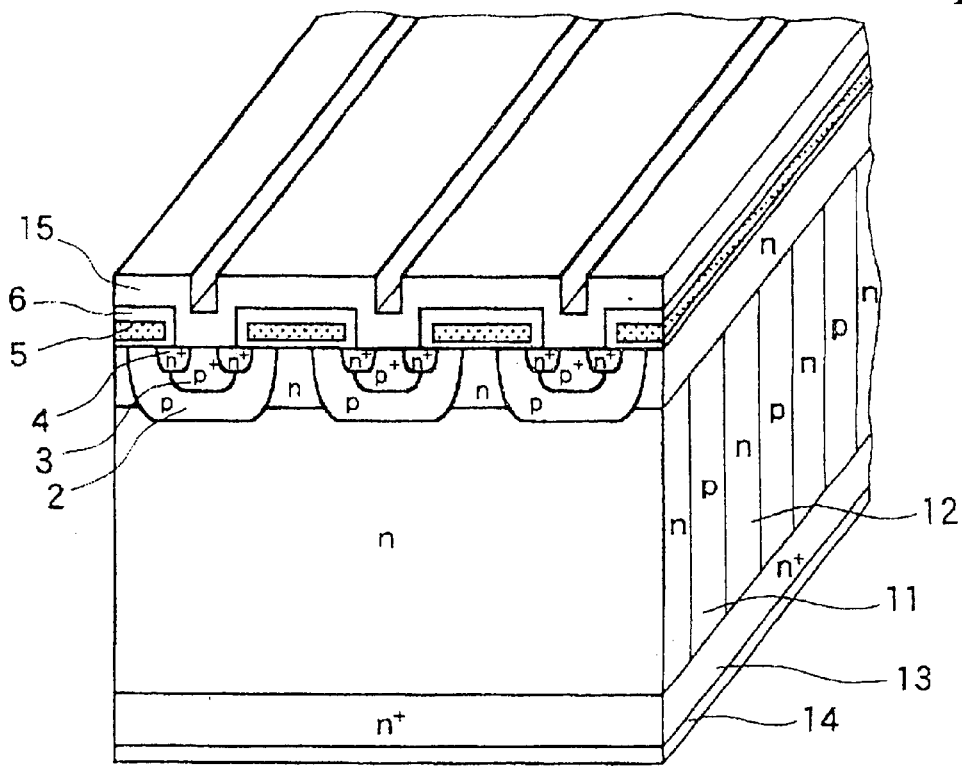
FIG. 23 is a perspective cross-sectional view of another vertical super-junction MOSFET manufactured by the manufacturing method according to any of the second through fourth embodiment of the invention.

FIG. 22 is a perspective cross-sectional view of a vertical super-junction MOSFET manufactured by the manufacturing method according to any of the second through fourth embodiments. The vertical super-junction MOSFET of FIG. 22 includes an alternating conductivity type layer, the constituent regions thereof being extended in parallel to the repetitive units of the MOSFET structure. FIG. 23 is a perspective cross-sectional view of another vertical super-junction MOSFET manufactured by manufacturing the method according to any of the second through fourth embodiments. The vertical super-junction MOSFET of FIG. 23 includes an alternating conductivity type layer, the constituent regions thereof being extended in perpendicular to the repetitive units of the MOSFET structure. As shown in these figures, n-type drift regions 12 and p-type partition regions 11 may be extended in parallel or in perpendicular to the repetitive units of the MOSFET structure formed in the surface portion of the semiconductor substrate. When n-type drift regions 12 and p-type partition regions 11 are extended in perpendicular to the repetitive units of the MOSFET structure formed in the surface portion of the semiconductor substrate as shown in FIG. 23, it is not necessary to adjust the locations of n-type drift regions 12 and p-type partition regions 11 with respect to the above MOSFET structure and, therefore, it is easy to further narrow n-type drift regions 12 and p-type partition regions 11. The structural details of the vertical super-junction MOSFET's shown FIGS. 22 and 23 have been described already with reference to FIG. 1.

Fifth Embodiment

Figure 24:
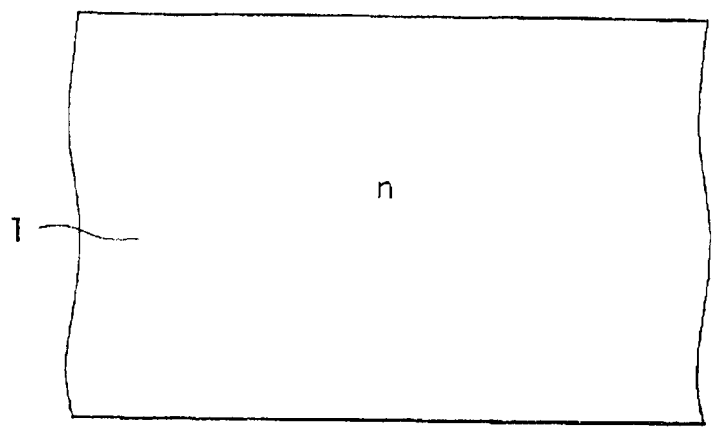
FIGS. 24 through 26 are cross-sectional views for explaining the steps of manufacturing a surface MOSFET structure.
Figure 25:
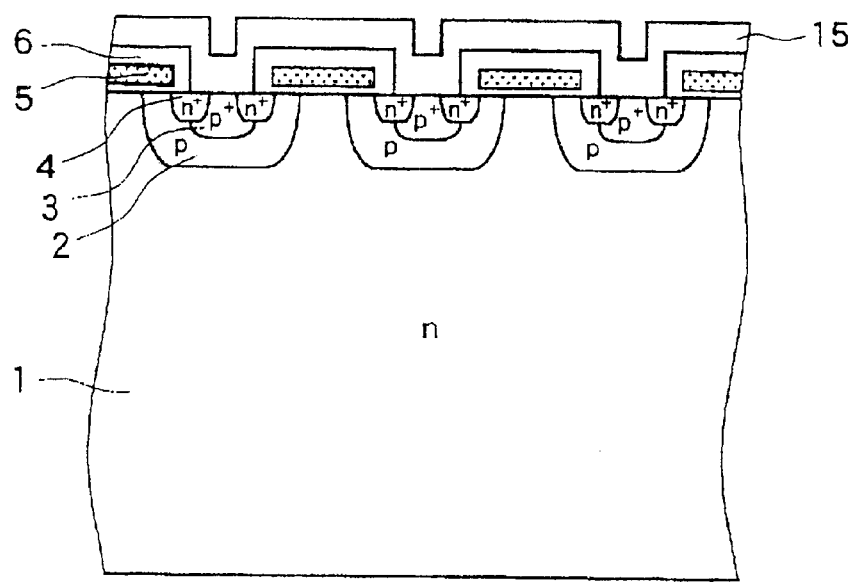
Figure 26:
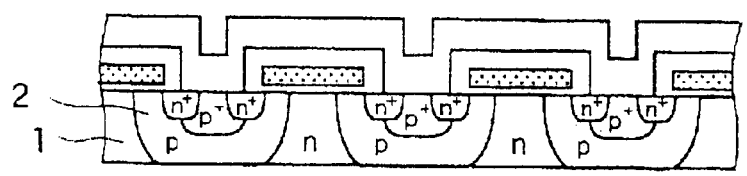
Figure 29:
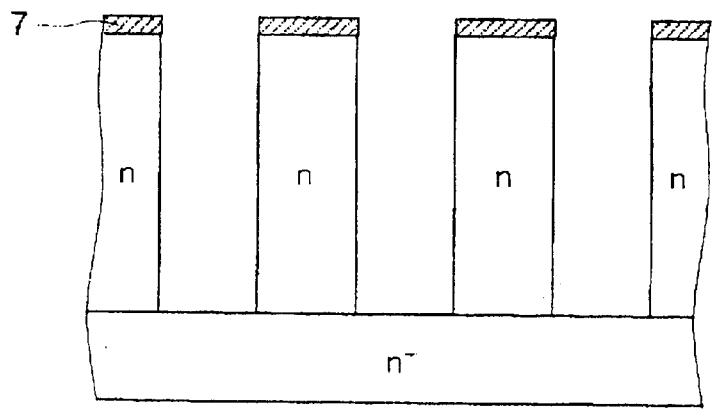
Figure 30:
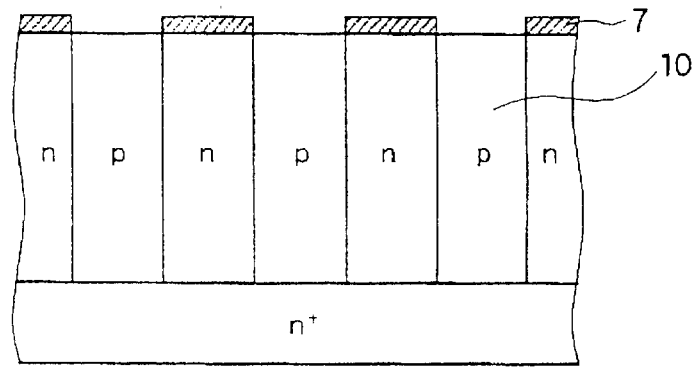
Figure 31:
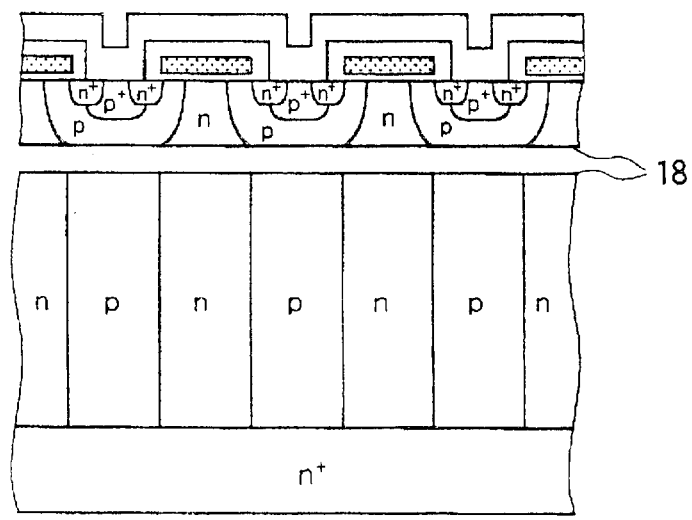
Figure 32:
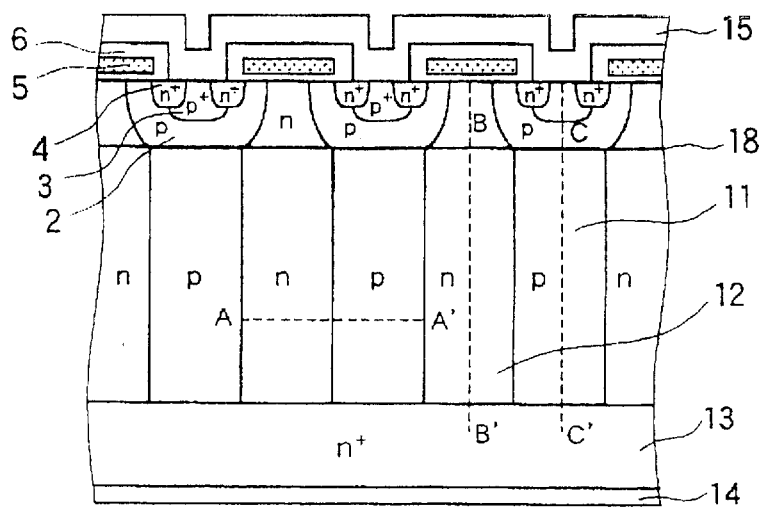

Now, a method of manufacturing a super-junction MOSFET according to a fifth embodiment of the invention will be described. FIGS. 24 through 26 are cross-sectional views for explaining the steps of manufacturing a surface MOSFET structure. FIGS. 27 through 32 are cross-sectional views for explaining the steps of manufacturing a super-junction MOSFET according to a fifth embodiment of the invention using the surface MOSFET structure manufactured through the steps described with reference to FIGS. 24 through 26. According to the fifth embodiment, a super-junction MOSFET is manufactured by bonding, as shown in FIGS. 31 and 32, the surface MOSFET structure manufactured separately through the steps described in FIGS. 24 through 26 and the alternating conductivity type layer manufactured separately through the steps described in FIGS. 27 through 30.

FIGS. 24 through 26 describe the usual double diffusion steps for manufacturing a surface MOSFET structure. Referring now to FIG. 24, an n-type semiconductor substrate 1 is prepared and contact holes are bored in the same manner as according to the second embodiment shown in FIG. 2. Referring now to FIG. 25, a surface MOSFET structure is formed and, then, a source electrode 15 is formed. In different from the manufacturing method according to the second embodiment, substrate 1 is polished mechanically from the back surface thereof to obtain a surface MOSFET structure with a predetermined thickness in the step shown in FIG. 26. Preferably, the thickness of the surface MOSFET structure remaining after the polishing is equal to or smaller than the junction depth (xj) of p-type base region 2.

Figure 27:
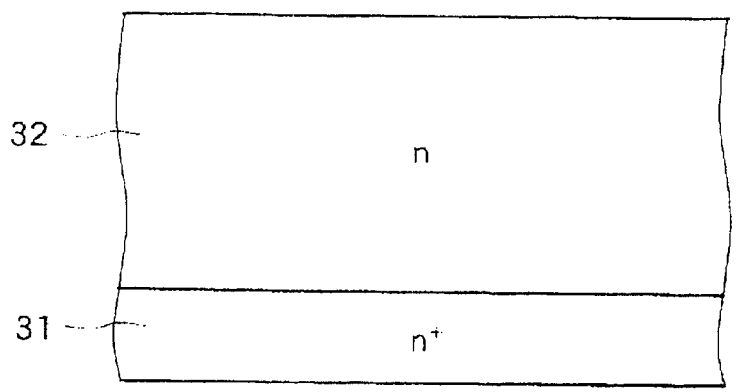
FIGS. 27 through 32 are cross-sectional views for explaining the steps of manufacturing a super-junction MOSFET according to the fifth embodiment of the invention using the surface MOSFET structure manufactures through the steps described with reference to FIGS. 24 through 26.
Figure 28:
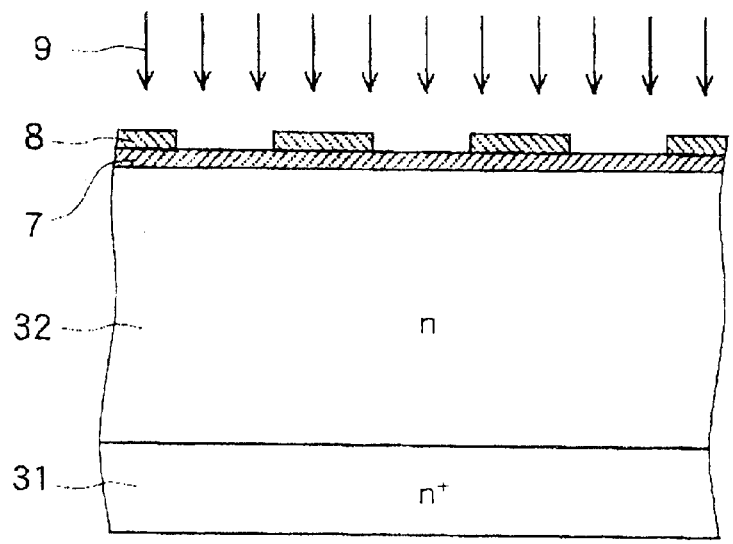

Referring now to FIG. 27, a semiconductor base plate, including an n+-type semiconductor substrate 31 and an n-type epitaxial layer 32 on semiconductor substrate 31, is prepared. Referring now to FIG. 28, an oxide film 7 is deposited by the CVD method on n-type epitaxial layer 32. A resist mask 8, having windows for defining the intended areas for p-type partition regions, is formed on oxide film 7. Oxide film 7 is etched in the areas below the windows of resist mask 8 by etching ions 9. Referring now to FIG. 29, resist mask 8 is removed, and trenches are dug by anisotropic etching using the remaining oxide film 7 as a mask. Referring now to FIG. 30, p-type epitaxial layers 10 are buried in the trenches by the selective epitaxial growth technique utilizing the fact that any Si single crystal does not grow on oxide film 7, oxide film 7 is removed, and the resulting alternating conductivity type layer is polished to a predetermined thickness.

Referring now to FIG. 30, the surface MOSFET structure manufactured through the steps shown in FIGS. 24 through 26 and the alternating conductivity type layer manufactured through the steps shown in FIGS. 27 through 30 are bonded with each other in respective bonding planes 18. The resulting semiconductor compact is treated thermally to obtain a super-junction MOSFET as shown in FIG. 32. Prior to the bonding, natural oxide films on the bonding planes are removed with a HF solution. The heat treatment for the bonding is conducted at 400° C., which is lower than the eutectic point in the binary system of Al used for source electrode 15 and Si, and under an applied pressure. Since the method of forming the trenches, the method of the selective epitaxial growth and the structure of the super-junction MOSFET shown in FIG. 32 are the same with those according to the second embodiment, their duplicated descriptions are omitted.

Figure 33A:
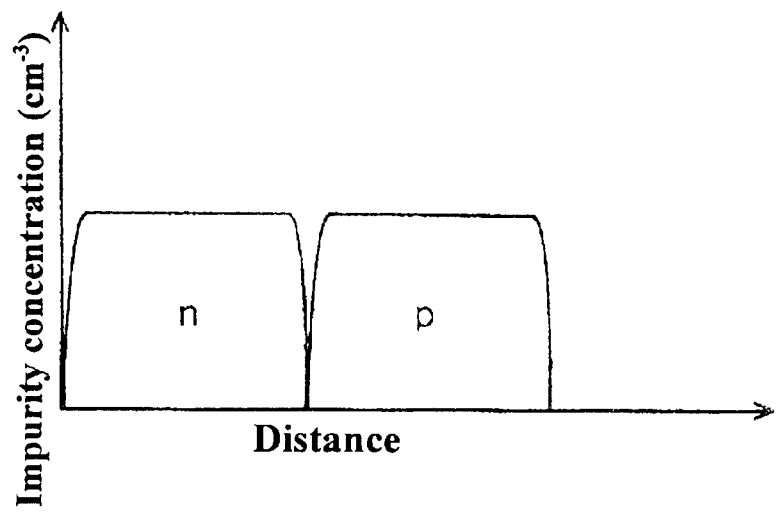
FIG. 33($a$) shows an impurity distribution profile in the cross section A–A' of FIG. 32.
Figure 33B:
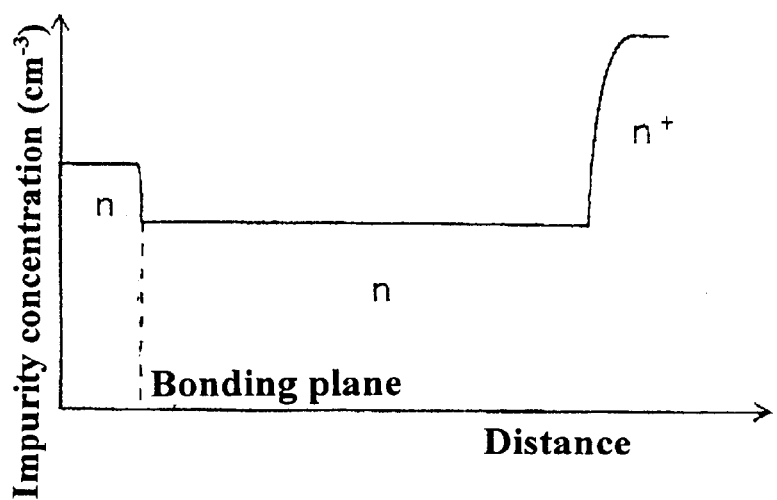
Figure 33C:
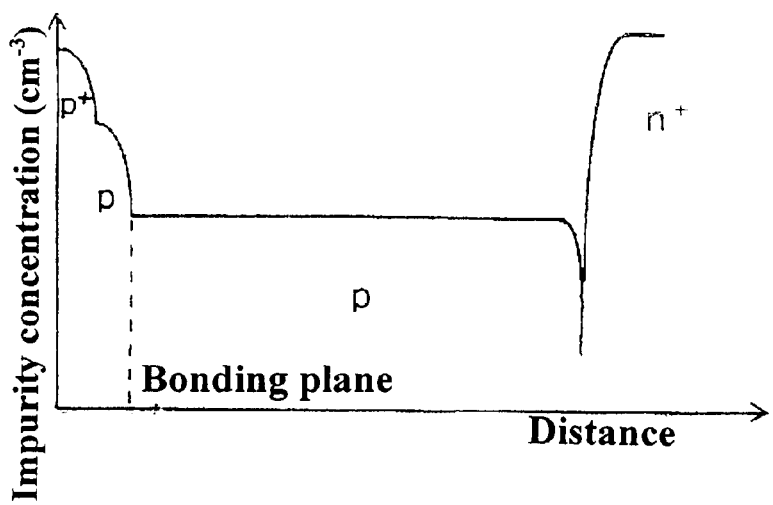
Figure 34:
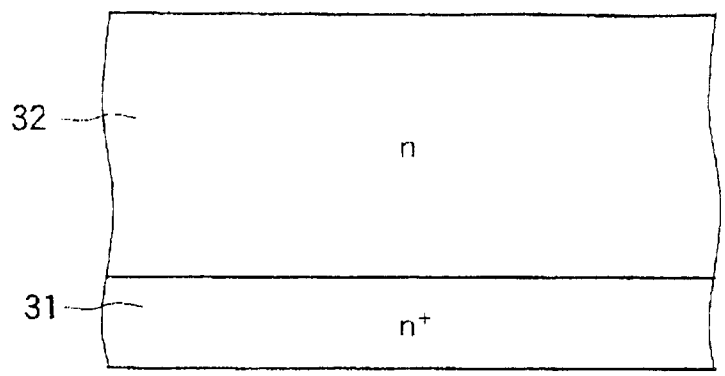
FIGS. 34 through 38 are cross-sectional views for explaining the steps of manufacturing a super-junction MOSFET according to the sixth embodiment of the invention.
Figure 35:
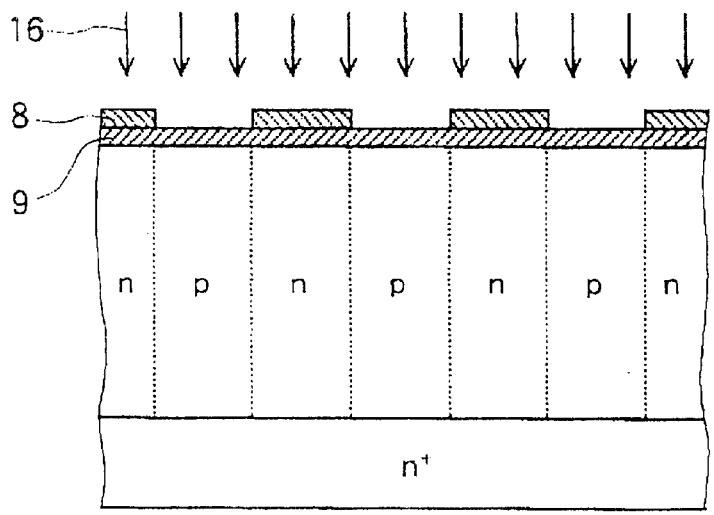
Figure 36:
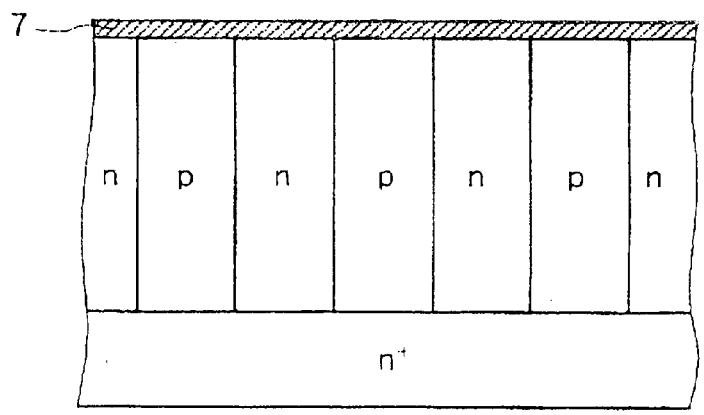
Figure 37:
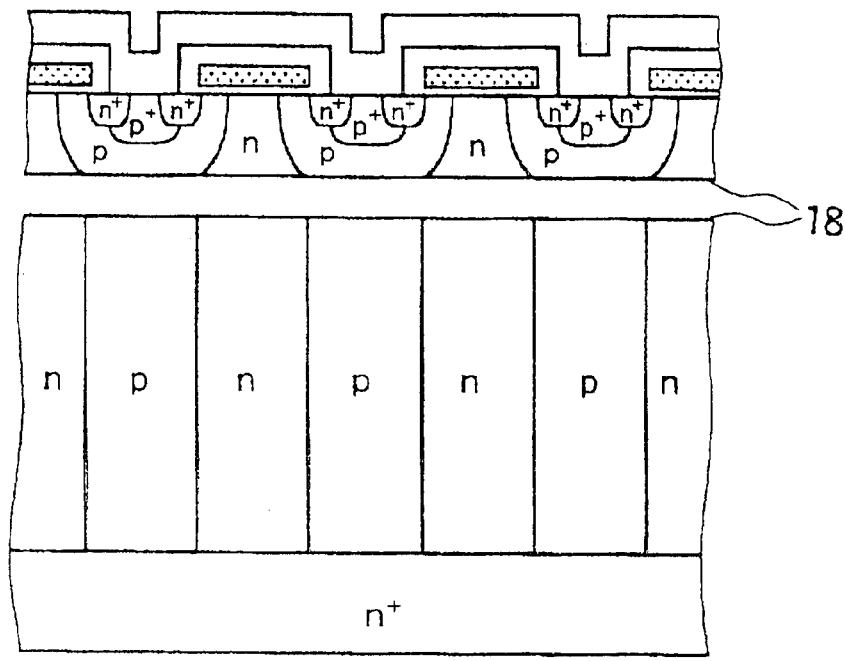

FIG. 33(a) shows an impurity distribution profile in the cross section A–A' of FIG. 32. FIG. 33(b) shows an impurity distribution profile in the cross section B–B' of FIG. 32. FIG. 33(c) shows an impurity distribution profile in the cross section C–C' of FIG. 32. As shown in FIG. 33(b), the impurity distribution in n-type drift region 12 is uniform, since the surface MOSFET structure and the alternating conductivity type layer are formed separately. Since the impurity distribution in p-type partition region 11 is also uniform as shown in FIG. 33(c), an ideal pn-junction is formed between n-type drift region 12 and p-type partition region 11. Moreover, since impurity concentration variation due to the compensation effect is hardly caused, it is easy to adjust the impurity concentration in each region. Since the surface MOSFET structure and the alternating conductivity type layer are bonded with each other, the impurity distribution changes sharply at the bonding plane.

Sixth Embodiment

Figure 38:
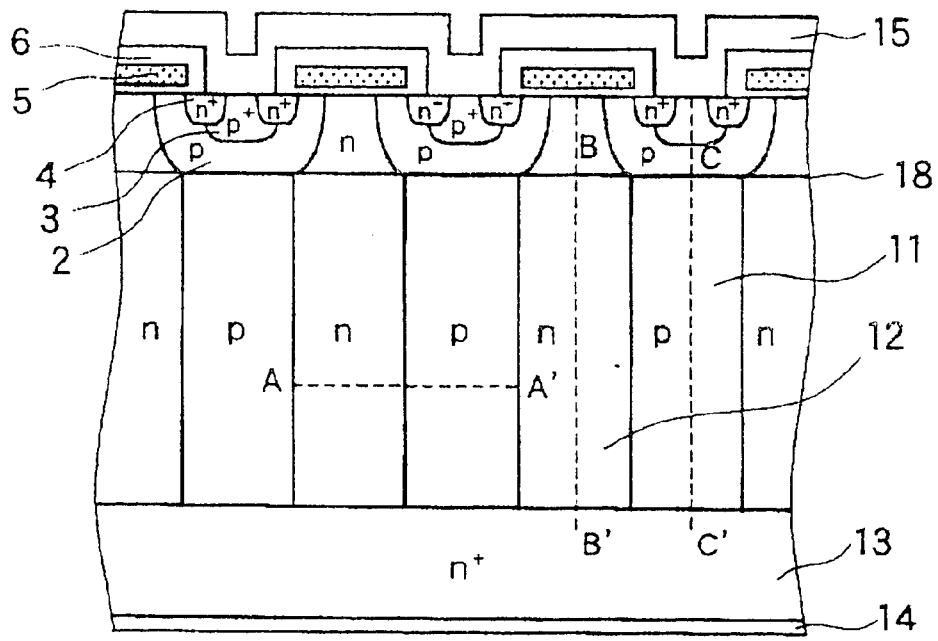

Now, a method of manufacturing a super-junction MOSFET according to a sixth embodiment of the invention will be described. FIGS. 34 through 38 are cross-sectional views for explaining the steps of manufacturing a super-junction MOSFET according to a sixth embodiment of the invention. The manufacturing method according to the sixth embodiment is different from the manufacturing method according to the fifth embodiment in that p-type partition regions 11 are formed by implanting boron ions at a high energy and by thermally driving the implanted boron ions according to the sixth embodiment. The manufacturing method according to the sixth embodiment forms p-type partition regions 11 in the alternating conductivity type layer by implanting boron ions 16 at a high energy in the step shown in FIG. 35. The other manufacturing steps according to the sixth embodiment are the same with the corresponding manufacturing steps according to the fifth embodiment. The steps for manufacturing the surface MOSFET structure are the same with the steps shown in FIGS. 24 through 26. Therefore, the final super-junction MOSFET shown in FIG. 38 is the same with the super-junction MOSFET shown in FIG. 32.

Figure 39A:
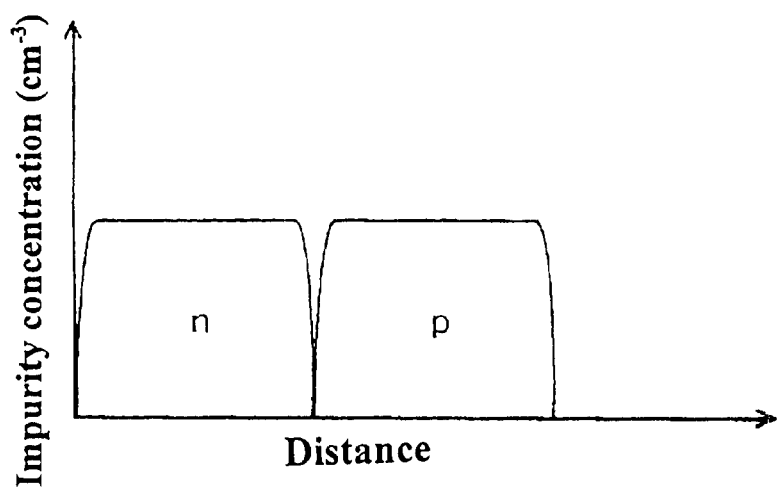
FIG. 39($a$) shows an impurity distribution profile in the cross section A–A' of FIG. 38.
Figure 39B:
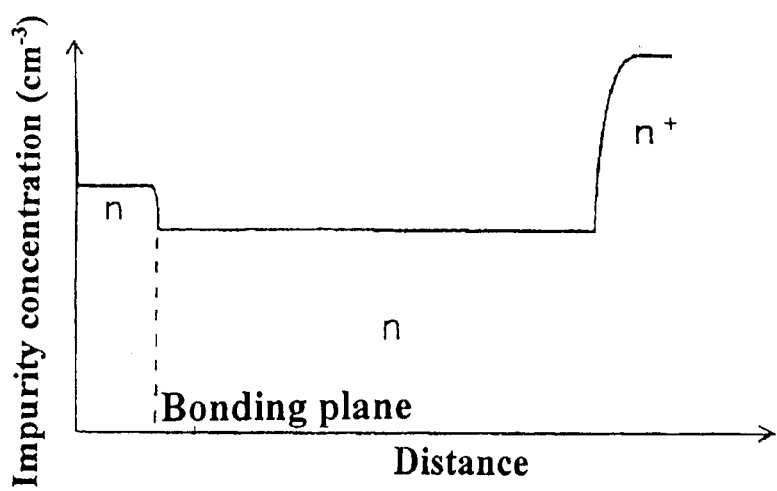
Figure 39C:
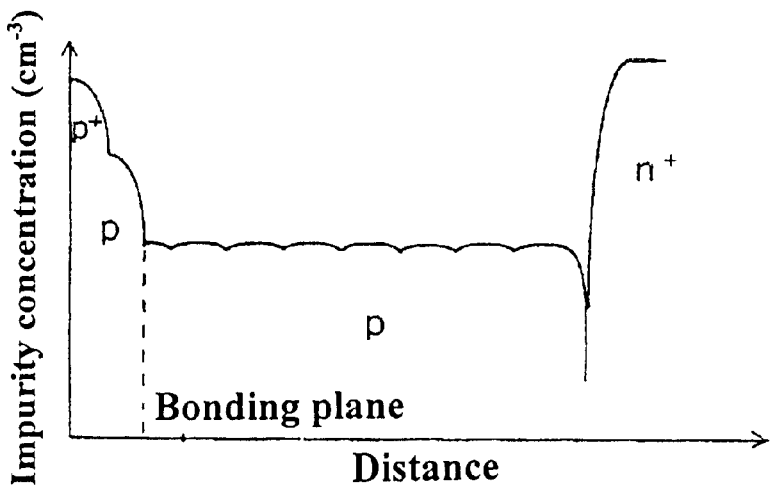
Figure 40:
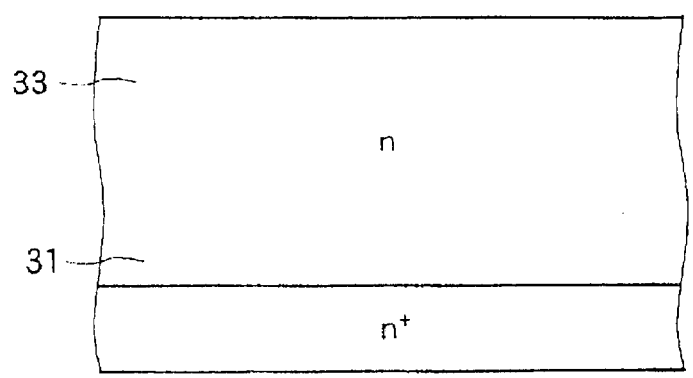
FIGS. 40 through 45 are cross-sectional views for explaining the steps of manufacturing a super-junction MOSFET according to the seventh embodiment of the invention.
Figure 41:
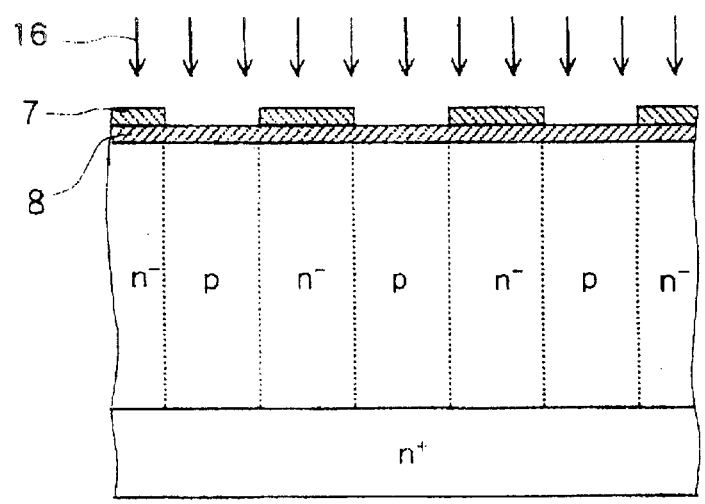
Figure 42:
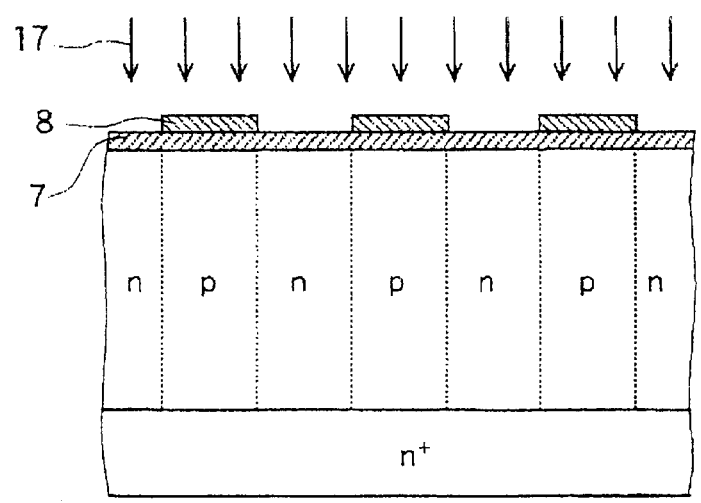
Figure 43:
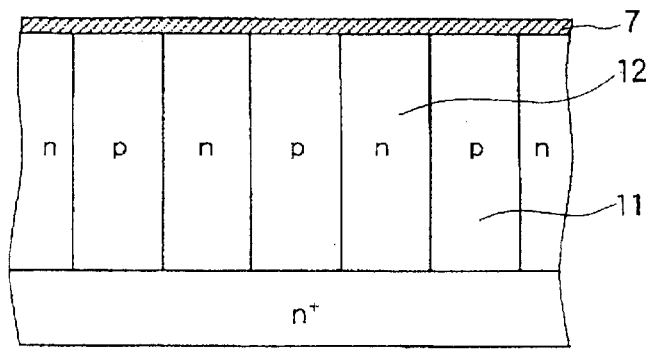
Figure 44:
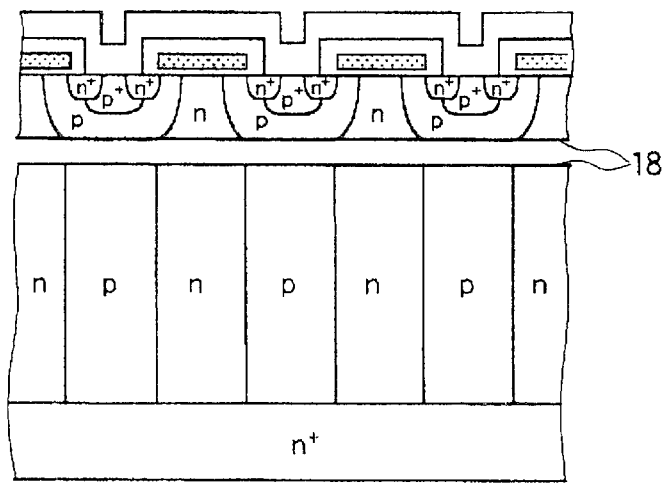

FIG. 39(a) shows an impurity distribution profile in the cross section A–A' of FIG. 38. FIG. 39(b) shows an impurity distribution profile in the cross section B–B' of FIG. 38. FIG. 39(c) shows an impurity distribution profile in the cross section C–C' of FIG. 38. Since p-type partition regions 11 are formed by implanting boron ions 16 and by the succeeding thermal drive, a wave-shaped vertical impurity distribution profile is caused in p-type partition region 1. However, any vertical deviation of the impurity concentration is not caused in p-type partition region 11, since boron ions 16 are implanted into multiple locations spaced apart for a certain distance vertically and the implanted regions are treated thermally.

Seventh Embodiment

Now, a method of manufacturing a super-junction MOSFET according to a seventh embodiment of the invention will be described. FIGS. 40 through 45 are cross-sectional views for explaining the steps of manufacturing a super-junction MOSFET according to a seventh embodiment of the invention. The manufacturing method according to the seventh embodiment is different from the manufacturing method according to the sixth embodiment in that n-type drift regions 12 are formed also by implanting phosphorus ions 17 at a high energy and by thermally driving the implanted phosphorus ions according to the seventh embodiment. According to the seventh embodiment, boron ions 16 are implanted in the step shown in FIG. 41 and phosphorus ions 17 are implanted in the step shown in FIG. 42. The other manufacturing steps according to the seventh embodiment are the same with the corresponding manufacturing steps according to the sixth embodiment.

Figure 45:
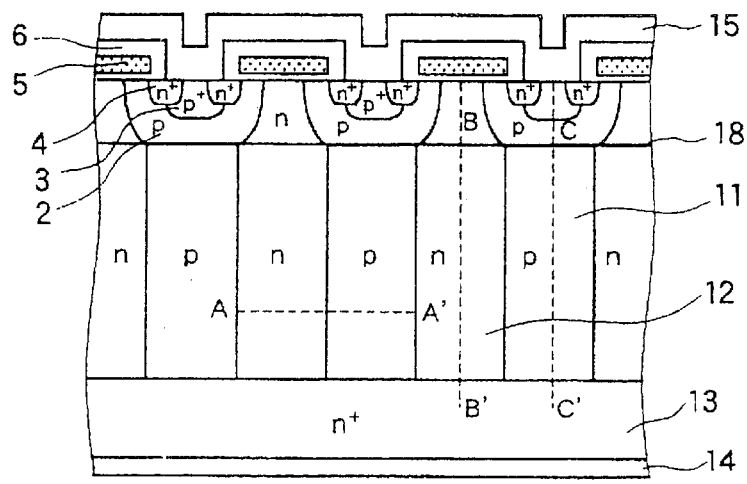
Figure 46A:
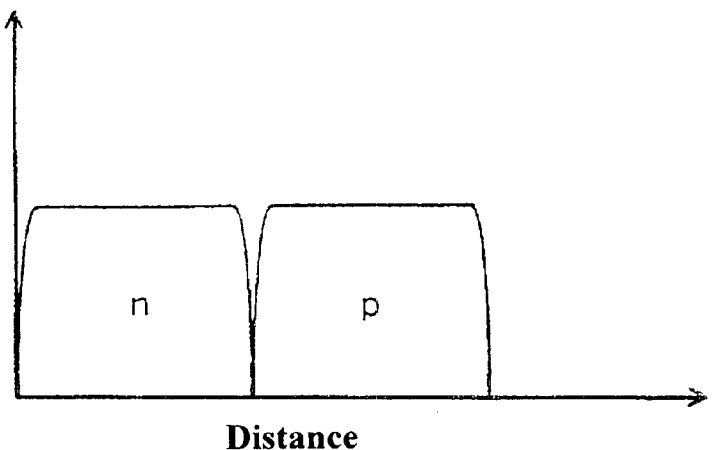
FIG. 46($a$) shows an impurity distribution profile in the cross section A–A' of FIG. 45.
Figure 46B:
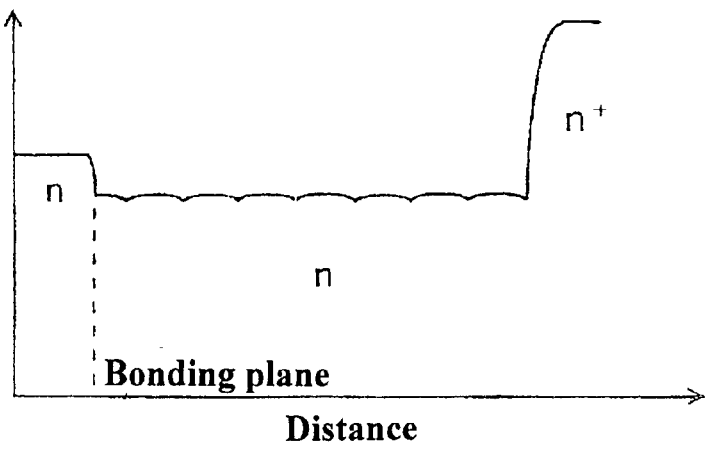
Figure 46C:
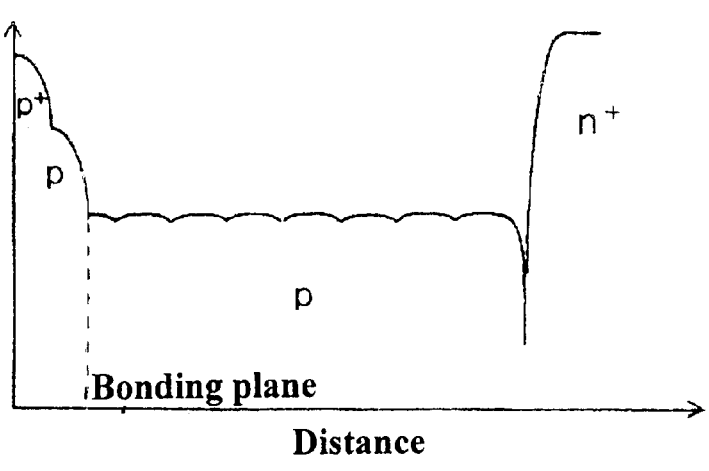

FIG. 46(a) shows an impurity distribution profile in the cross section A–A' of FIG. 45. FIG. 46(b) shows an impurity distribution profile in the cross section B–B' of FIG. 45. FIG. 46(c) shows an impurity distribution profile in the cross section C–C' of FIG. 45. As shown in FIGS. 46(b) and 46(c), wave-shaped vertical impurity distribution profiles are caused in n-type drift regions 12 and p-type partition regions 11, since p-type partition regions 11 and n-type drift regions 12 are formed by implanting boron ions 16 and phosphorus ions 17, respectively, and by thermally driving the implanted ions. However, any vertical deviation of the impurity concentration is not caused in the regions 11 and 12. Since the boundary regions between the regions 11 and 12 are not affected so much by the thermal diffusion, the pn-junctions formed between n-type drift regions 12 and p-type partition regions 11 according to the seventh embodiment are close to the ideal ones.

Figure 47:
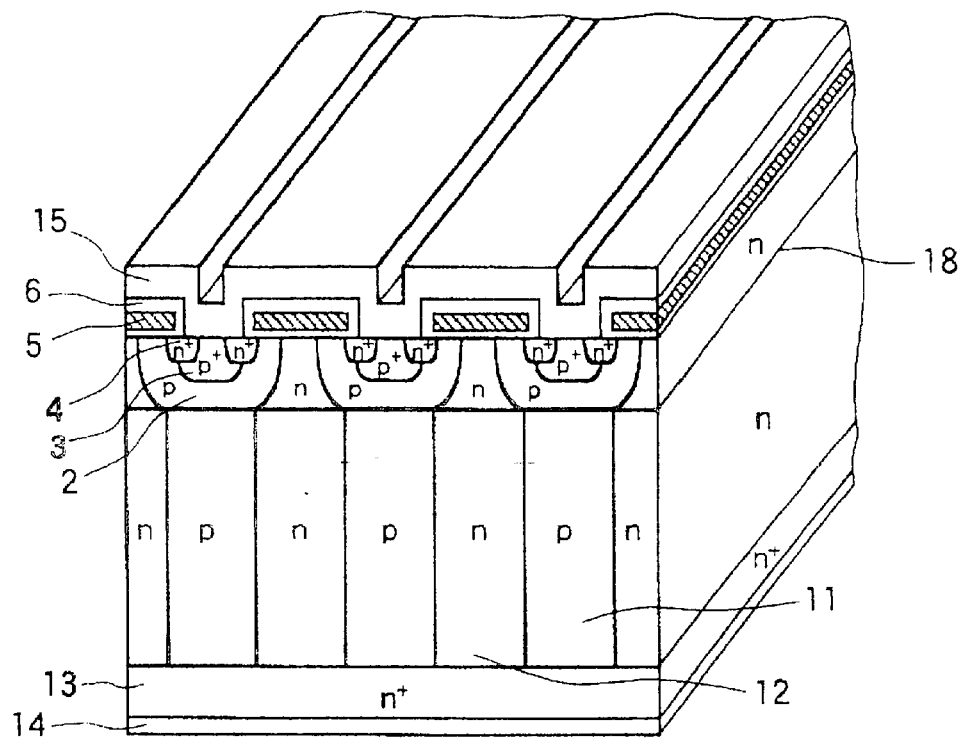
FIG. 47 is a perspective cross-sectional view of a vertical super-junction MOSFET manufactured by the manufacturing method according to any of the fifth through seventh embodiments of the invention.
Figure 48:
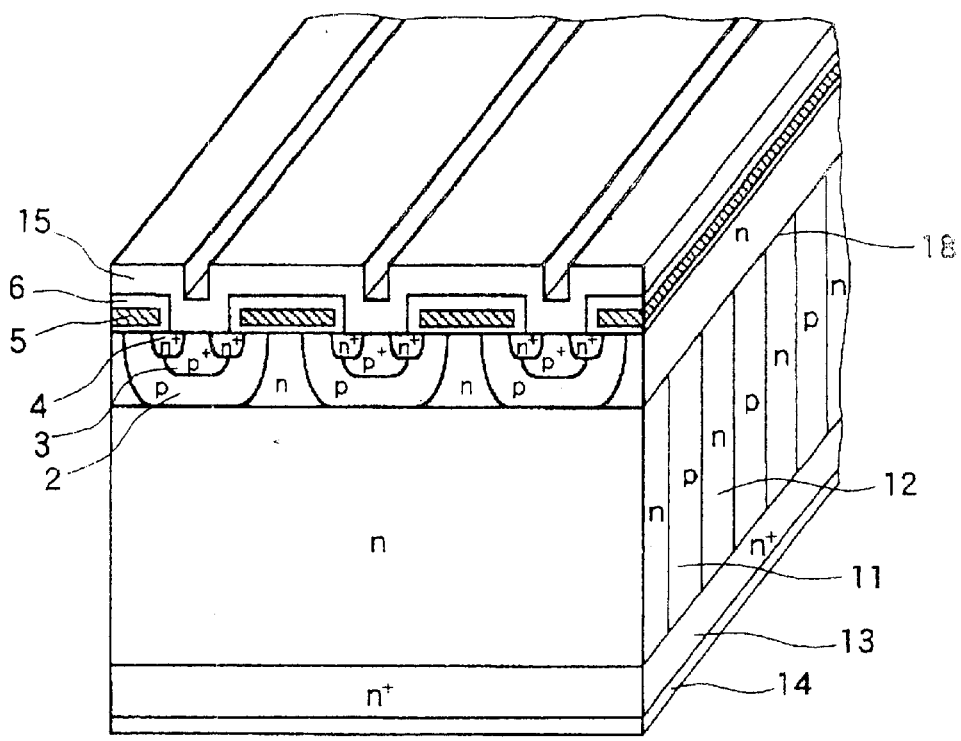
FIG. 48 is a perspective cross-sectional view of another vertical super-junction MOSFET manufactured by the manufacturing method according to any of the fifth through seventh embodiments of the invention.

FIG. 47 is a perspective cross-sectional view of a vertical super-junction MOSFET manufactured by the manufacturing method according to any of the fifth through seventh embodiments. The vertical super-junction MOSFET of FIG. 47 includes an alternating conductivity type layer, the constituent regions thereof being extended in parallel to the repetitive units of the surface MOSFET structure. FIG. 48 is a perspective cross-sectional view of another vertical super-junction MOSFET manufactured by manufacturing the method according to any of the fifth through seventh embodiments. The vertical super-junction MOSFET of FIG. 48 includes an alternating conductivity type layer, the constituent regions thereof being extended in perpendicular to the repetitive units of the MOSFET structure. As shown in these figures, n-type drift regions 12 and p-type partition regions 11 may be extended in parallel or in perpendicular to the repetitive units of the surface MOSFET structure. When n-type drift regions 12 and p-type partition regions 11 are extended in perpendicular to the repetitive units of the surface MOSFET structure as shown in FIG. 48, it is not necessary to adjust the locations of n-type drift regions 12 and p-type partition regions 11 with respect to the surface MOSFET structure and, therefore, it is easy to further narrow n-type drift regions 12 and p-type partition regions 11.

Figure 49:
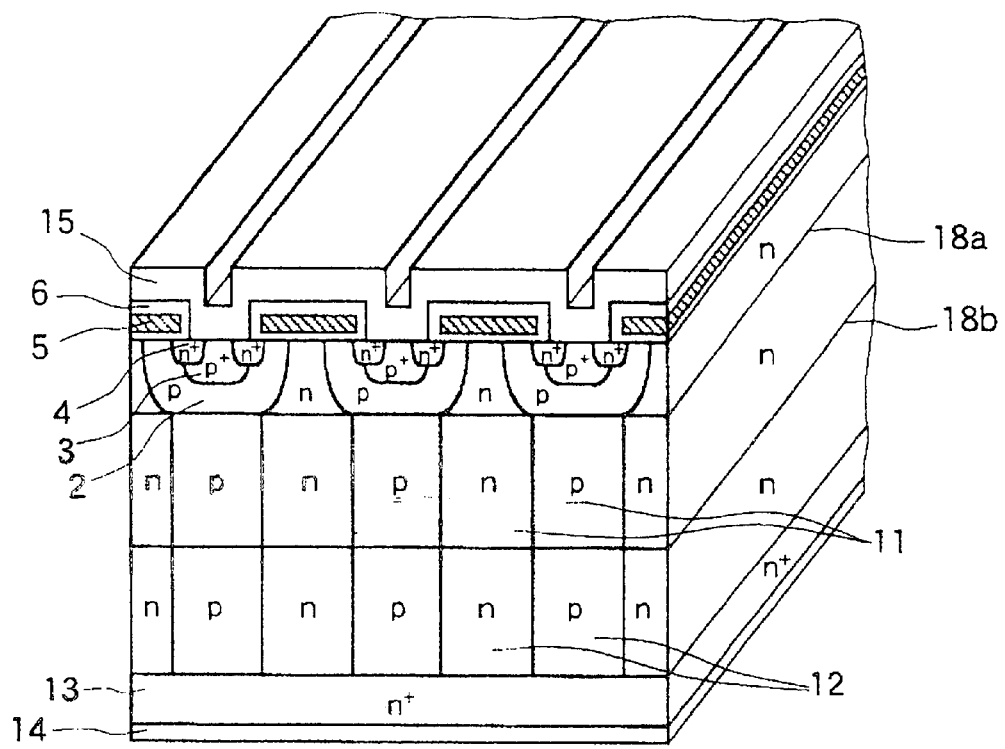
FIG. 49 is a perspective cross-sectional view of a vertical super-junction MOSFET including two alternating conductivity type layers manufactured by the manufacturing method according to any of the fifth through seventh embodiments of the invention.
Figure 50:
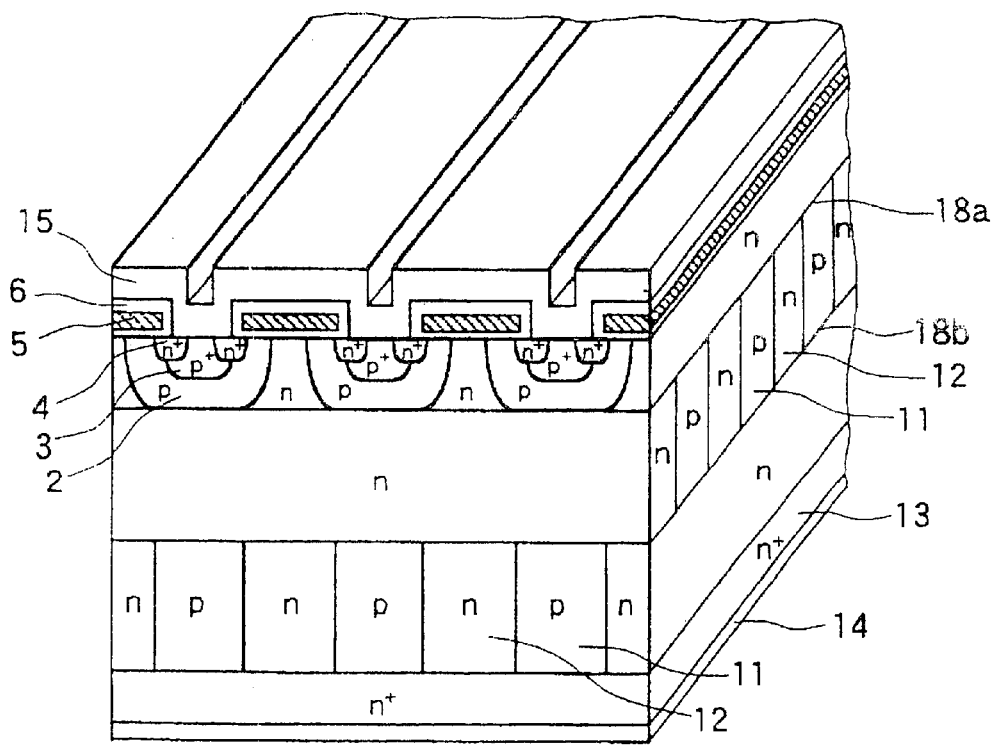
FIG. 50 is a perspective cross-sectional view of another vertical super-junction MOSFET including two alternating conductivity type layers manufactured by the manufacturing method according to any of the fifth through seventh embodiments of the invention.
Figure 51:
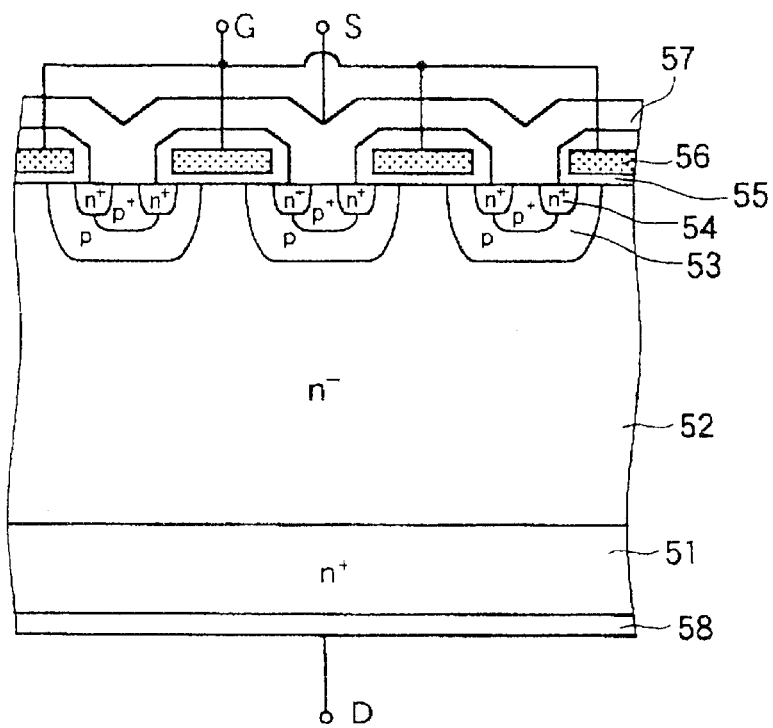
FIG. 51 is a cross-sectional view of a conventional planar-type n-channel MOSFET.

FIG. 49 is a perspective cross-sectional view of a vertical super-junction MOSFET including two alternating conductivity type layers manufactured by the manufacturing method according to any of the fifth through seventh embodiments of the invention. FIG. 50 is a perspective cross-sectional view of another vertical super-junction MOSFET including two alternating conductivity type layers manufactured by the manufacturing method according to any of the fifth through seventh embodiments of the invention. Referring now to FIG. 49, the vertical super-junction MOSFET includes two bonding planes 18a and 18b. The surface MOSFET structure and one of the alternating conductivity type layers are bonded at the bonding planes 18a such that the constituent regions of the alternating conductivity type layer are extending in parallel to the repetitive units of the surface MOSFET structure. The alternating conductivity type layers are bonded at the bonding planes 18b such that the constituent regions of one of the alternating conductivity type layers are extending in parallel to the constituent regions of another one of the alternating conductivity type layers. Referring now to FIG. 50, the vertical super-junction MOSFET also includes two bonding planes 18a and 18b. The surface MOSFET structure and one of the alternating conductivity type layers are bonded at the bonding planes 18a such that the constituent regions of the alternating conductivity type layer are extending in perpendicular to the repetitive units of the surface MOSFET structure. The alternating conductivity type layers are bonded at the bonding planes 18b such that the constituent regions of one of the alternating conductivity type layers are extending in perpendicular to the constituent regions of another one of the alternating conductivity type layers. The bonding structures as shown in FIGS. 49 and 50 is preferable to obtain a thick alternating conductivity type layer and, therefore, to obtain a high breakdown voltage.

The invention is applicable also to Schottky barrier diodes, freewheel diodes, IGBT's, and bipolar transistors. Although the invention has been described in connection with the preferred embodiments thereof, changes and modifications are obvious to those skilled in the art without departing from the true spirits of the invention. Therefore, the invention be understood not by the specific disclosures herein but by the appended claims thereof.

As explained above, the method of manufacturing a vertical super-junction semiconductor device according to the invention facilitates reducing the number of thermally treating the alternating conductivity type layer, preventing characteristics of the super-junction semiconductor device from being impaired and manufacturing the super-junction semiconductor device with reduced costs and with an excellent mass-productivity.

What is claimed is:

1. A method of manufacturing a semiconductor device, said semiconductor device including a semiconductor chip having a first major surface, a second major surface facing opposite to said first major surface, a device structure in the first major surface, and an alternating conductivity type layer between said first major surface and said second major surface, said alternating conductivity type layer being formed of first semiconductor regions of a first conductivity type and second semiconductor regions of a second conductivity type, said first semiconductor regions and said second semiconductor regions being arranged alternately with each other, said method comprising:

forming at least a part of said first semiconductor regions or said second semiconductor regions from the side of said second major surface.

2. The method according to claim 1, wherein said device structure comprises a MIS structure, a pn-junction or a Schottky junction.

3. The method according to claim 1, the method further comprising forming at least a part of said device structure prior to forming at least a part of said first semiconductor regions or said second semiconductor regions from the side of said second major surface.

4. The method according to claim 1, wherein said forming at least a part of said first semiconductor regions or said second semiconductor regions from the side of said second major surface comprises forming trenches by selective etching and burying said trenches by epitaxial growth.

5. The method according to claim 4, wherein said epitaxial growth comprises selective epitaxial growth or liquid phase epitaxial growth.

6. The method according to claim 4, wherein said selective etching comprises anisotropic etching.

7. The method according to claim 4, wherein the first semiconductor regions of a first conductivity type or the second semiconductor regions of a second conductivity type are formed on the side of said second major surface by implanting impurity ions of the first conductivity type or the second conductivity type and thermally treating said ions.

8. The method according to claim 9, wherein the impurity concentration in said first semiconductor regions or said second semiconductor regions is $1\times10^{18}$ cm$^3$ or higher.

9. The method according to claim 4, wherein a bottom face of each of said trenches comprises a (110) plane or a (100) plane of silicon and side face of each of said trenches comprises a (111) plane of silicon.

10. The method according to claim 1, wherein said forming at least a part of said first semiconductor regions or said second semiconductor regions from the side of said second major surface comprises selectively implanting impurity ions or repeating the selectively implanting impurity ions and heat treatment.

11. The method according to claim 1, the method further comprising polishing said semiconductor chip mechanically or chemically, prior to or after forming said alternating conductivity type layer, from the side of said second major surface, whereby to provide said alternating conductivity type layer with a predetermined thickness from said first major surface.

12. A method of manufacturing a semiconductor device including an alternating conductivity type layer, said semiconductor device including a first semiconductor chip having a first major surface, and a device structure in said first major surface, and a second semiconductor chip having at least a part of said alternating conductivity type layer, said alternating conductivity type layer being formed of first semiconductor regions of a first conductivity type and second semiconductor regions of a second conductivity type, said first semiconductor regions and said second semiconductor regions being arranged alternately with each other, said method comprising:

connecting said first semiconductor chip and said second semiconductor chip with each other.

13. The method according to claim 12, wherein said second semiconductor chip has a second major surface facing opposite to said first major surface, and a main electrode on said second major surface.

14. The method according to claim 12, wherein said connecting comprises bonding said first semiconductor chip and said second semiconductor chip with each other.

15. The method according to claim 12, wherein said semiconductor device further includes a third semiconductor chip having at least another part of said alternating conductivity type layer, and the method comprises bonding said first semiconductor chip and said third semiconductor chip, and bonding said third semiconductor chip and said second semiconductor chip.

16. The method according to claim 14 or 15, wherein a bonding portions of said semiconductor chips are polished, oxide films are removed and said bonding steps are conducted at a predetermined temperature.

17. The method according to claim 12, wherein said first semiconductor regions or said second semiconductor regions are buried by epitaxial growth in a trenches formed by selective etching.

18. The method according to claim 17, wherein said epitaxial growth comprises selective epitaxial growth or liquid phase epitaxial growth.

19. The method according to claim 17, wherein said selective etching comprises anisotropic etching.

20. The method according to claim 19, wherein a bottom face of each of said trenches comprises a (110) plane or a (100) plane of silicon and a side face of each of said trenches comprises a (111) plane of silicon.

21. The method according to claim 12, wherein at least a part of said first semiconductor regions or at least a part of said second semiconductor regions is formed by selectively implanting impurity ions of the first conductivity type or the second conductivity type one or more times and thermally treating said ions.

* * * * *